United States Patent [19]

Welch

[11] Patent Number: 5,663,584

[45] Date of Patent: Sep. 2, 1997

[54] SCHOTTKY BARRIER MOSFET SYSTEMS AND FABRICATION THEREOF

[76] Inventor: James D. Welch, 10328 Pinehurst Ave., Omaha, Nebr. 68124

[21] Appl. No.: 368,149

[22] Filed: Dec. 29, 1994

Related U.S. Application Data

[63] Continuation-in-part of Ser. No. 250,906, May 31, 1994, abandoned.

[51] Int. Cl.⁶ ............................................. H01L 29/76
[52] U.S. Cl. .................. 257/288; 257/369; 257/382; 257/383; 257/471; 257/599; 257/902
[58] Field of Search ........................ 257/383, 288, 257/369, 382, 471, 599, 902

[56] References Cited

U.S. PATENT DOCUMENTS

| | | | |
|---|---|---|---|
| 4,300,152 | 11/1981 | Lepselter | 357/42 |
| 4,485,550 | 12/1984 | Koeneke et al. | 29/571 |
| 4,696,093 | 9/1987 | Welch | 437/176 |
| 5,049,953 | 9/1991 | Mihara et al. | 357/15 |
| 5,177,568 | 1/1993 | Honma et al. | 257/295 |

OTHER PUBLICATIONS

Etched Schottky Barrier Mosfets Using a Single Mask, Hogeboom & Cobbold, Elec. Lett., vol. 7, No. 5/6, pp. 133–144 Jan. 1971.

SB–IGFET: An Insulated Gate Field Effect Transistor using Schottky Barrier Contacts for Source and Drain, Lepselter & Sze Proc IEEE, 56, Jan. 1968 pp. 1400–1402.

Some Properties of Chromium Doped Silicon, Lebedev & Sultanov, Soviet Physics, vol. 4, No. 11, pp. 1900–1902, Jan. 1971.

Compound Formation Between Amorphous Silicon and Chromium, Yacobie et al., J. App. Phys. 51(12), pp. 6424–6425, Jan. 1980.

Metalurgical and Electrical Properties of Chromium Silicon Interfaces, Martinez et al., Solid State Phys., vol. 22, pp. 55–64, Jan. 1980.

Formation Kinetics of CrSi2 Films on Si Substrates with and with–out interposed Pd2S; Layer, Olowolafe et al., J. App. Phys., vol. 47, No. 12 pp. 5182–5186 Jan. 1976.

Primary Examiner—Edward Wojciechowicz
Attorney, Agent, or Firm—James D. Welch

[57] ABSTRACT

(MOS) device systems-utilizing Schottky barrier source and drain to channel region junctions are disclosed. Experimentally derived results which demonstrate operation of fabricated N-channel and P-channel Schottky barrier (MOSFET) devices, and of fabricated single devices with operational characteristics similar to (CMOS) and to a non-latching (SRC) are reported. Use of essentially non-rectifying Schottky barriers in (MOS) structures involving highly doped and the like and intrinsic semiconductor to allow non-rectifying interconnection of, and electrical accessing of device regions is also disclosed. Insulator effected low leakage current device geometries and fabrication procedures therefore are taught. Selective electrical interconnection of drain to drain, source to drain, or source to source, of N-channel and/or P-channel Schottky barrier (MOSFET) devices formed on P-type, N-type and Intrinsic semiconductor allows realization of Schottky Barrier (CMOS), (MOSFET) with (MOSFET) load, balanced differential (MOSFET) device systems and inverting and non-inverting single devices with operating characteristics similar to (CMOS), which devices can be utilized in modulation, as well as in voltage controled switching and effecting a direction of rectification.

62 Claims, 8 Drawing Sheets

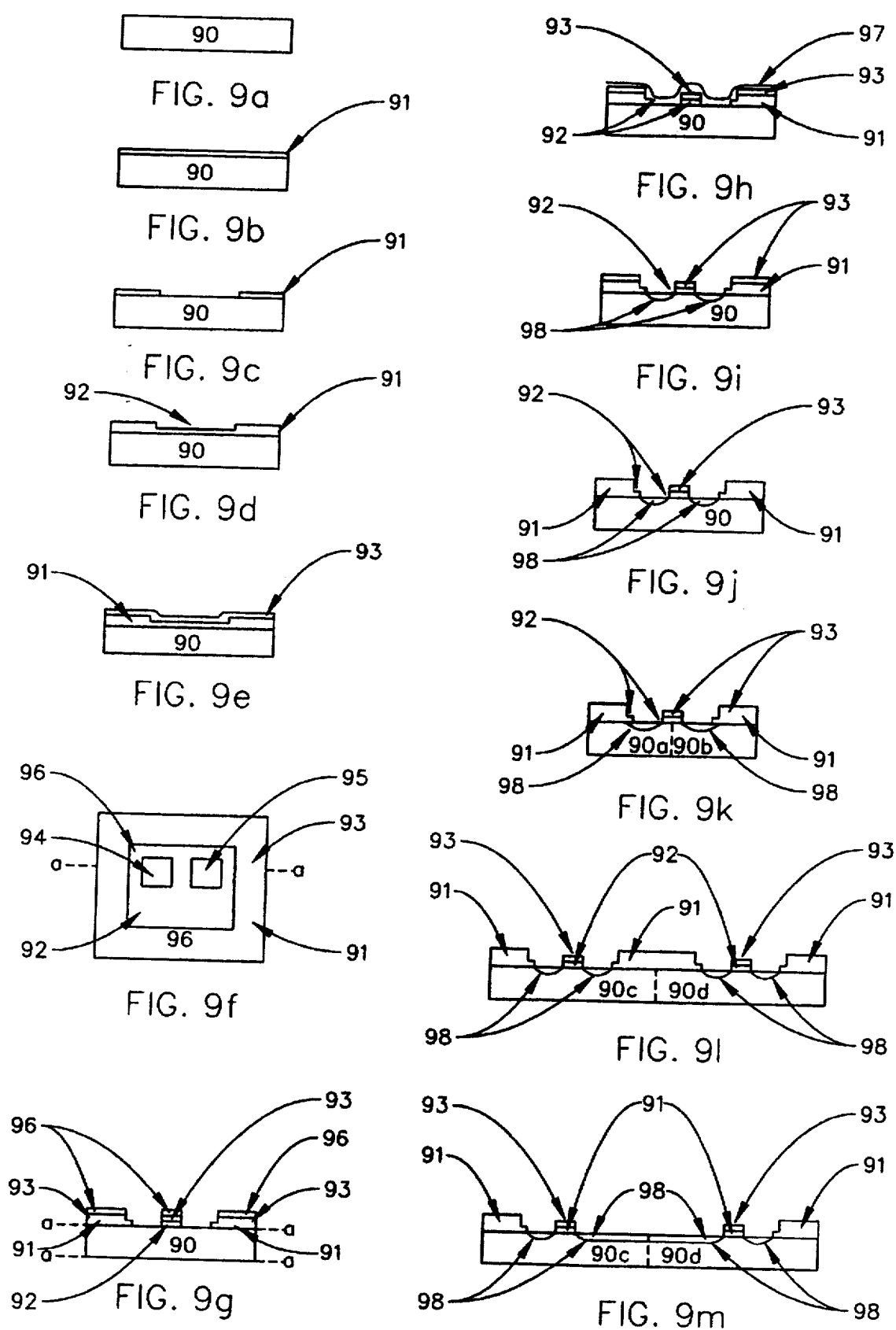

FIG. 11a$_0$
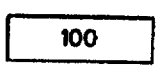
FIG. 11a$_1$
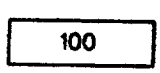
FIG. 11a$_2$
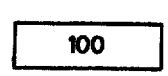
FIG. 11a$_3$
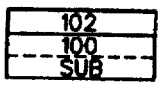
FIG. 11b$_0$
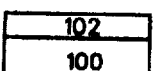
FIG. 11b$_1$
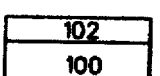
FIG. 11b$_2$
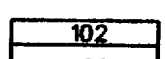
FIG. 11b$_3$
FIG. 11c$_0$
FIG. 11c$_1$
FIG. 11c$_2$
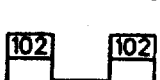
FIG. 11c$_3$
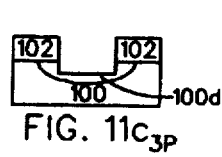
FIG. 11c$_{3P}$
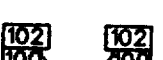
FIG. 11d$_0$
FIG. 11d$_1$
FIG. 11d$_2$
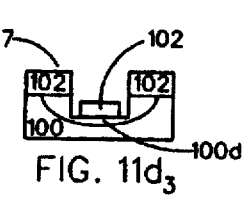
FIG. 11d$_3$
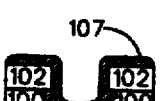
FIG. 11e$_0$
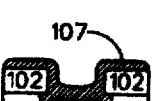
FIG. 11e$_1$
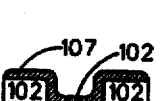
FIG. 11e$_2$
FIG. 11e$_3$
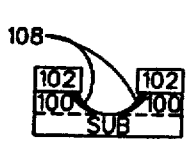
FIG. 11f$_0$
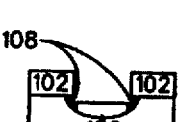
FIG. 11f$_1$
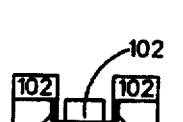
FIG. 11f$_2$
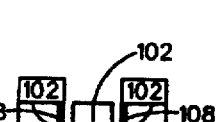
FIG. 11f$_3$
FIG. 11g$_0$
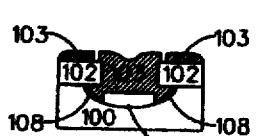
FIG. 11g$_1$
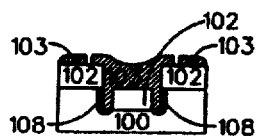
FIG. 11g$_2$
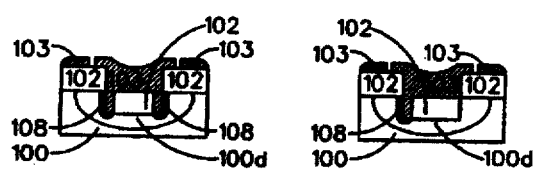
FIG. 11g$_3$
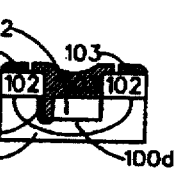
FIG. 11g$_{3P}$

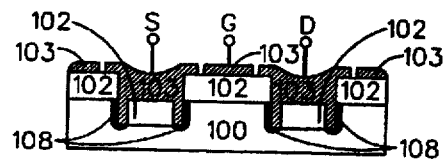
FIG. 11h$_a$
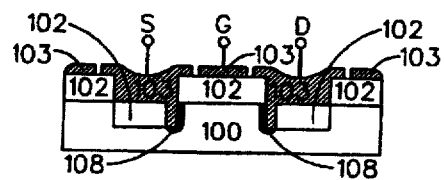
FIG. 11h$_b$
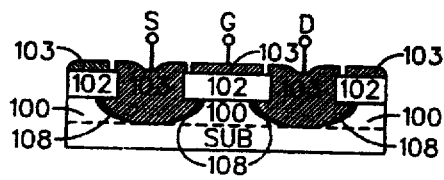
FIG. 11i
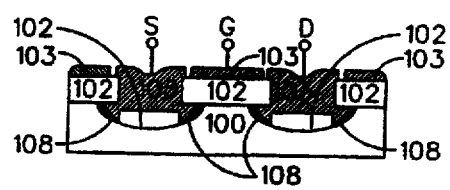
FIG. 11j
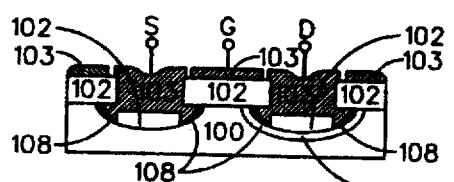
FIG. 11k
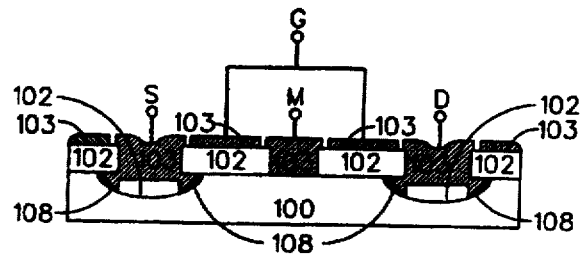
FIG. 11l
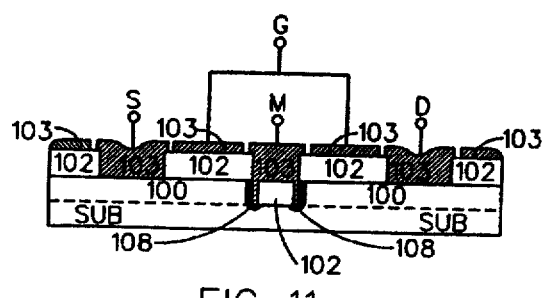
FIG. 11m
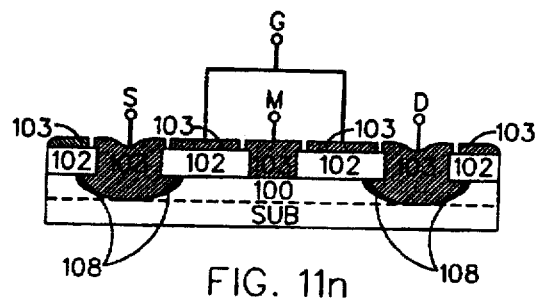
FIG. 11n
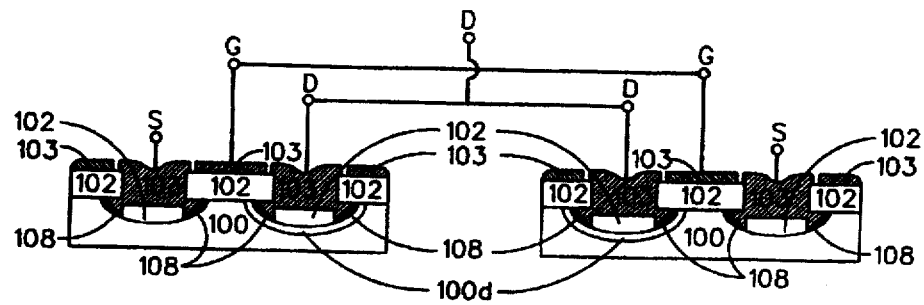
FIG. 11o

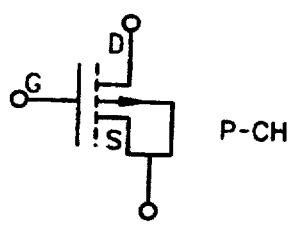
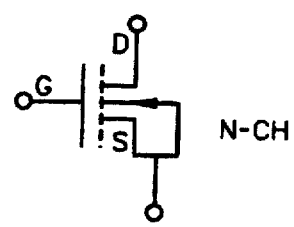
FIG. 12a  FIG. 12b
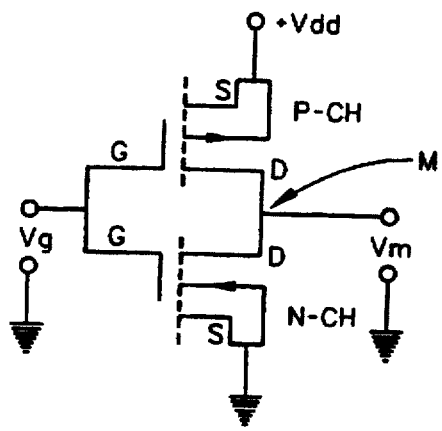
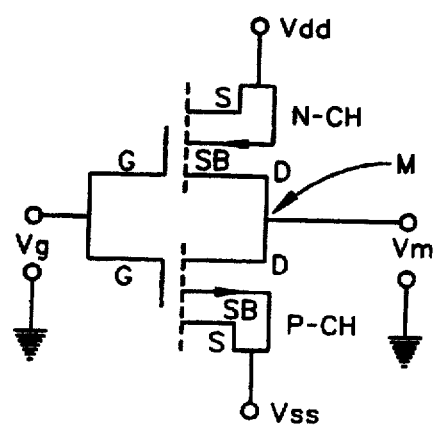
FIG. 13a  FIG. 13b
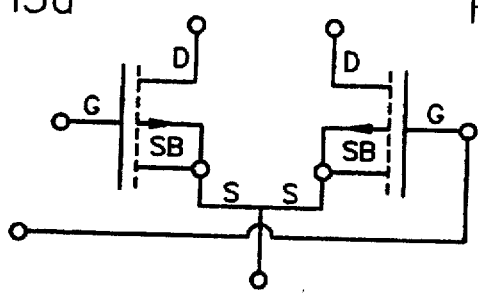
FIG. 14
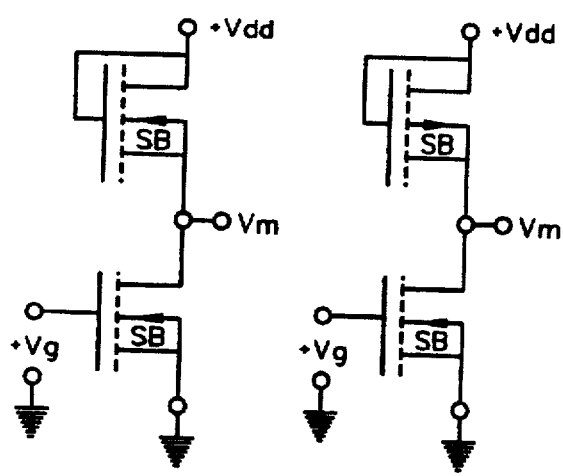
FIG. 15a  FIG. 15b
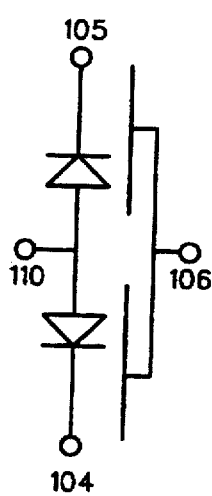
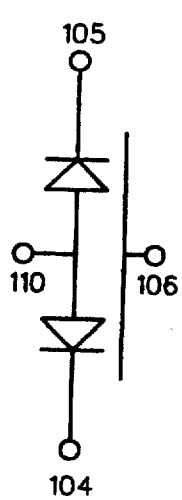
FIG. 16a  FIG. 16b

SCHOTTKY BARRIER MOSFET SYSTEMS AND FABRICATION THEREOF

This application is a continuation-in-part of application Ser. No. 08/250,906 filed on May 31, 1994, now abandoned.

The invention in this application was developed in part under support provided by a grant from the Energy Related Inventions Program of the United States Federal Department of Energy, Contract No. DE-FG47-93R701314. The United States Government has certain rights in this invention.

TECHNICAL FIELD

The present invention relates to Metal Oxide Semiconductor (MOS) device systems and procedures for fabrication thereof. More particularly, the present invention comprises single semiconductor type, Schottky barrier junction inverting and noninverting single devices which demonstrate operational characteristics similar to Complimentary Metal Oxide Semiconductor (CMOS) multiple device systems, and Schottky barrier junction voltage controlled switches which demonstrate operational characteristics similar to a non-latching silicon controlled rectifier. In addition the present invention is, in part, a system utilizing insulator effected, channel end located, minimized Schottky barrier junction area, low leakage current Schottky barrier rectifying junction geometries in Intrinsic, N and/or P-Type semiconductor, preferably in a single substrate, to form Complimentary Metal Oxide Semiconductor Field Effect Transistor (CMOS) device systems, as well as N or P-channel Metal Oxide Semiconductor Field Effect Transistor (MOSFET) devices with (MOSFET) loads, and N or P-channel balanced differential (MOSFET) device systems. The present invention utilizes both rectifying and semiconductor doping and the like effected non-rectifying Schottky barrier junctions.

BACKGROUND

The use of conventional diffused junction N and P-Channel Metal Oxide Semiconductor Field Effect Transistors, (hereinafter (MOSFETS), in functional seriesed combination to form Complimentary Metal Oxide Semiconductor, (hereinafter (CMOS)), field effect transistor device systems is well known, as are the benefits associated with the use thereof. Said benefits include enabling realization of very low power consumption digital switching logic circuitry such as is found in electronic wrist watches which run for years on one small battery.

Briefly, a conventional (MOSFET) is comprised of N or P-type semiconductor substrate, in the surface region of which are formed regions of oppositely doped material, separated by a distance therebetween in said semiconductor substrate. The regions of oppositely doped material are termed the "Source" and "Drain" and the distance therebetween is termed the "Channel Region". Diffused rectifying junctions are thus caused to exist at the ends of the channel region, both at the source and at the drain. Continuing, atop the channel region surface is present an insulating material, such as silicon dioxide, atop of which insulating material is present a "Gate" which is made from an electrically conductive material. Application of a voltage from the drain-to-source of a proper polarity, simultaneous with the application of a gate-to-source voltage of a proper polarity causes the channel region to "invert" and become of a doping type similar to that in the source and drain regions, thereby providing a conductive pathway between said drain and source. That is, application of a gate-to-source voltage modulates the conductivity of, hence flow of current between, the drain and source. Because the resistivity of the insulating material is high, very little gate current is required to effect modulation of said drain to source current flow. As mentioned above, conventional (CMOS) device systems comprise a seriesed combination of electrically connected N and P-channel (MOSFET) devices, formed on P and N-type semiconductor respectively. To form (CMOS) the drain of an N-channel (MOSFET) device is electrically connected to the drain of the a P-channel (MOSFET) device and the source of the P-channel device is connected to a positive (+Vdd), while the source of the N-channel (MOSFET) device is connected to a lower voltage (-Vss), typically ground. In use, a relatively low, (approximately the voltage appplied to the source of the N-channel (MOSFET) device), gate voltage applied simultaneously to the gates of said electrically connected devices modulates the P channel device so that it conducts, while having no channel conductivity increasing effect on the N channel device. Similarly, simultaneous application of a relatively high, (with respect to the voltage applied to the source of the N-channel (MOSFET) device, eg. approximately +Vdd), gate voltage affects the N and P channel devices in an opposite manner. That is the N-channel device channel inverts and conductivity is effectively increased from the associated source to drain, while the P-channel device channel conductivity is not increased. The result being that varying gate-to-source voltage from relatively low, (-Vss), to relatively high, (+Vdd), causes the voltage present at the electrically connected N and P-channel device drains, which terminal is essentially electrically isolated from the gates, to vary essentially between that applied to the source of the P-channel device, (+Vdd), and that applied to the source of the N-channel device, (typically, but not necessarily, ground potential), respectively. Said (CMOS) is then inverting between input and output. As mentioned above, (CMOS) switching is effected with very little gate current flow, as the insulating material between the gate and the semiconductor is of a very high resistance, (eg. ten-to-the-forteenth ohms or higher). As well, drain to source current flows only briefly at the switching point when both devices are momentarily conducting. This is because current cannot flow through an electrically connected series of (MOSFETS) when either thereof does not have a conducting inverted channel present. Conventional (MOSFET) and (CMOS) operational characteristics are described in numerous circuit design texts such as "Basic Integrated Circuit Engineering" by Hamilton and Howard, McGraw-Hill; 1975.

While conventional (CMOS) device systems provide benefits, fabrication thereof is by diffused junction technology which requires many steps, including many photoresist procedures, sequential mask alignments, and various etches. It is to be appreciated that each such step involves an efficiency factor, and thereby introduces defects leading to decreased yield of working devices on a fabrication substrate. In some instances the ratio of working to the total devices attempted on a substrate can be fifty (50%) percent or even less. For instance if a procedure step carries a ninety (90%) percent efficiency factor, (an extremely low value used for demonstrative purposes), after two such steps only eighty-one (81%) percent of the devices will be operational. After six (6) such steps, it should be appreciated, the effective yield of working devices will be less than fifty (50%) percent. Obviously, if the number of steps in a fabrication procedure can be reduced the yield of working devices can be increased. However, conventional diffused junction technology does not allow reducing the number of steps involved in a fabrication procedure below a relatively large number.

A fabrication procedure which requires a reduced number fabrication procedure steps to provide functionally equivalent (CMOS) device systems would therefore be of utility.

With that in mind it is to be appreciated that an alternative to conventional diffused junction technology is that of Schottky barrier junction technology. The present invention utilizes said schottky barrier junction technology in a fabrication procedure requiring a relatively few number of steps to provide Schottky Barrier (CMOS) device systems and a single substrate type single device equivalent to (CMOS).

A Schottky barrier is essentially a rectifying junction formed between, for instance, a nonsemiconductor (eg. metal or metal compound), and a doped semiconductor. Such a junction exhibits a "built-in" Schottky barrier potential which serves to inhibit current conduction when a voltage of one polarity is applied thereto, and allows current to flow more easily when an opposite polarity voltage is applied thereto. In important respects then, a Schottky barrier acts much like a diffused junction rectifier.

A Search of relevant references has provided an article by Hogeboom and Cobbold, titled "Etched Schottky Barrier (MOSFETS) Using A Single Mask". Said article describes the fabrication of a P-Channel (MOSFET) on N-type silicon with aluminum forming the rectifying junction schottky barrier source and drain junctions. (Note that aluminum does not form a rectifying junction schottky barrier on P-type silicon hence is not an appropriate metal for use in realization of N-channel Schottky barrier (MOSFETS)). Said article also describes both N and P-Channel conventional diffused junction (MOSFETS) fabricated using a single mask, but which required a diffusion of a dopant, hence, did not operate based upon schottky barrier junction presence. Aluminum present provided non-rectifying contact to diffused regions as in conventional (MOSFETS). This paper also suggests the use of vanadium to form source and drain regions. It is also noted that this paper describes use of a silicon dioxide undercutting etch which facilitates self delineation of fabricated devices when essentially line-of-sight aluminum deposition is achieved. (The silicon etchant taught is a mixture of fifty (50) parts acetic acid, thirty (30) parts nitric acid, twenty (20) parts hydrofluoric acid and one (1) part aniline). A Patent to Welch, U.S. Pat No. 4,696,093 describes a procedure for fabricating Schottky barrier (MOSFETS), including an approach requiring only one-mask and one-etch and the use of chromium, (which after application to silicon is subjected to an annealing procedure to form chromium disilicide), as the metal used to form rectifying source and drain Schottky barrier junctions. A Masters Thesis presented by James D. Welch at the University of Toronto in 1974 titled "Design and Fabrication of Sub-Micron Channel MOS Transistors by Double Ion-Implantation" mentions Schottky barrier rectifying junctions discovered to exist after a thirty (30) minute, six-hundred-fifty (650) degree centigrade anneal of chromium present on the back, unpolished, side of an N-type silicon substrate. The reverse breakdown voltage of said rectifying junctions was found to be upwards of eighty (80) volts. However, said thesis work did not include investigation of annealing deposited chromium on P-type silicon. A paper by Lebedev and Sultanov, in Soviet Physics Semiconductors, Vol. 4, No. 11, May 1971, pages 1900–1902 teaches the chromium diffused into P-type Silicon at high, (eg. twelve hundred (1200) degrees centigrade), for long periods of time, (eg. twenty (20) to fifty (50) hours), dopes said P-type silicon N-type. Nothing, however, is stated regarding the properties of chromium disilicide formed by annealing a thin film of chromium which has been deposited upon said P-type silicon silicon at lower temperatures. A paper by Lepselter and Sze, titled "SB-IGFET: An Insulated-Gate Field Effect Transistor Using Schottky Barrier Contacts for Source and Drain", in the Proceedings of the IEEE, August 1968, pages 1400 through 1402 describes a P-Channel schottky barrier insulated gate field effect transistor, (ie. IGFET), fabricated using schottky barrier junctions for source and drain. Said IGFET utilized platinum silicide in the formation of the source and drain junctions. It is stated that during operation the source junction of the device is reverse biased in the inverted channel region and that reverse leakage or tunneling current therethrough is what applied gate voltage modulates. The Lepselter et al. article however, makes no mention of the use of Schottky barriers to form N-Channel devices on P-type silicon. In fact, owing to the rather large reverse barrier height difference between platinum silicide and N-type silicon, (ie. 0.85 ev), and between platinum silicide and P-type silicon, (ie. 0.25 ev), it is unlikely that N-channel devices would be operablle, or even if they were, that an effective (CMOS) device system could be achieved using platinum-silicide to form both N and P-channel devices. This is because the (MOSFET) devices in a (CMOS) device system must have essentially symetrical and complimentary operational characteristics to provide efficient switching capability. The Lepselter et al. article provides an equation for calculating tunneling current density through a reverse biased Schottky barrier junction:

$$J = \exp\left(\frac{-4}{3} \quad \frac{(\text{SQRT } 2m^* (PHI)^{\frac{3}{2}})}{qhE}\right)$$

where
E is the electric field induced by application of a voltage across the junction,
m* is the effective mass,
h is Boltzman's constant,
PHI is the reverse barrier potential, and
J is current density.

The Lepselter et al. article is incorporated by reference herein. Many texts describe Schottky barrier junctions and they will not be further discussed in this Disclosure.

Continuing, a recent Patent to Honma et al., U.S. Pat. No. 5,177,568 describes a tunnel injection type semiconductor device having a Metal-Insulator-Silicon (MIS) structure comprising a semiconductor region, a source, a drain and a gate electrode wherein said source and drain are composed of a metal or metal compound member, respectively, and wherein both have an overlapping portion with said gate electrode. The Source provides a Schottky barrier junction to said semiconductor region while said drain provides an non-rectifying contact to said semiconductor region. A tunneling current is caused to flow across a Schottky barrier junction between said source and said drain, controlled by a gate voltage. This Patent describes formation of a (CMOS) device system wherein schottky barriers serve as source region contacts to N and P-type silicon and wherein interconnected drain contacts are non-rectifying. The devices described in this Patent are very interesting, but fabrication thereof obviously requires rather complicated channel region doping profile effecting and yield reducing steps to effect rectifying junctions at the source and non-rectifying junctions at the drain of a (MOSFET) structure. That is, economic savings as compared to conventional diffused junction (MOSFET) fabrication would seem to be reduced by the channel doping requirements. Use of doping and varying band gap materials are disclosed as approaches to realizing the device described. It is also noted that the devices described apparently operate, (show gate controlled drain current flow), with the semiconductor between source and drain "accumulated" while a source Schottky barrier junction is reverse biased by applied drain to source voltage polarity. That is for a N-type substrate, a positive gate to source voltage is applied and for a P-type semiconductor a negative polarity gate to source voltage would be applied. As will he seen in following Sections herein, present invention devices preferably operate by effecting "inversion" in semiconductor between source and drain. For instance, for an N-type semiconductor the applied gate voltage during operation is negative in polarity when applied drain to source voltage is positive in polarity. For P-type semiconductor the applied gate to source voltage polarity during operation is positive while the drain to source voltage polarity is negative. This is cited as a major distinction in operational bases between the Honma et al. devices and the present invention devices.

A Patent to Koeneke et al., U.S. Pat. No. 4,485,550 describes MOS and (CMOS) devices in which selective doping of regions surrounding Schottky barrier source and drain improves the operational characteristics of Schottky barrier MOS devices. The doping serves to reduce leakage current to the substrate in which said devices are fabricated and to increase current injected into the channel region. The later effect is at least partially due to the elimination of a gap between the channel region and Schottky barrier junctions at source and drain. Two problems inherrent in Schottky barrier (MOSFET) fabrication are thus attacked by the 550 Patent devices.

A Patent to Lepselter, U.S. Pat. No. 4,300,152 describes a (CMOS) device in which at least one of the N and P-Channel devices is a Schottky barrier based device. It is taught that a (CMOS) device system utilizing such is immune to latch-up based upon Silicon Controlled Rectifier-like action in (CMOS) device systems.

A Patent to Mihara et al., U.S. Pat. No. 5,049,953 describes a Schottky barrier device in which a shield layer of a second conductivity type imposed between a Schottky barrier and a substrate serves to reduce leakage current.

No known reference, however, teaches, as does the present invention disclosure, that a relatively simple fabrication procedure utilizing both N and P-type semiconductor can simultaneously efficiently form low, insulator effected, leakage current balanced Schottky barrier rectifying junctions in (MOSFET) Source and Drain regions on both said N and P-type semiconductor, preferably in a single semiconductor substrate, thereby allowing essentially balanced complimentary N and P-channel (MOSFETS) with Schottky barrier junctions at both source and drain to be easily achieved, particularly on a single substrate. This is a very significant point as it would not be obvious to one skilled in the art that such a single simultaneous procedure should exist or what elements, (eg. metal, metal-silicide and semiconductor), should be utilized in said procedure or what the procedure should be followed. The present invention provides missing teachings along with documented experimental results supporting said teachings. The present invention, however, goes even further and teaches that a single device equivalent to (CMOS) can be achieved on a single dopant type, or even intrinsic, semiconductor substrate utilizing Schottky barrier technology, with or without leakage current reducing insulator material presence, by provision of a voltage monitoring contact to the channel region under the gate electrode of a Schottky barrier (MOSFET) structure. As described elsewhere in this disclosure, said device operates because Schottky barriers formed using appropriate semiconductors and metals and/or metal silicides form rectifying junctions with either N or P-type semiconductor, and effective (MOSFET) channel region semiconductor doping can be effected by application of a gate voltage in a (MOSFET) structure. All known (CMOS) devices require the presence of N and P-type doped semiconductor. The present invention teaches that a single device equivalent to (CMOS), in contrast, requires only a single type, (N or P-type), semiconductor substrate be present, emphasis added. This enables cost savings and improved fabrication efficiency.

It is mentioned that in a proprietory report, dated Jan. 10, 1991, which was prepared by the National Institute of Standards and Technology, (NIST) in support of the grant which has funded work leading to the disclosure herein, it was concluded that the present invention could have an impact on energy conservation and utilization and that if the projected performance of the invention can be achieved, then commercial success seems assured. Said proprietory NIST report focused upon the use of chromium deposited onto both N and P-type silicon and a common anneal procedure to for Schottky barrier (MOSFETS) with rectifying junctions at both source and drain. Said NIST report was provided in response to a confidential application for grant funds submitted to the agency which is funding the present work, (the United States Department of Energy), years earlier by the inventor herein, in search of support to allow actual present invention reduction to practice.

The present invention teaches workable systems and recommended fabrication procedures therefore.

DISCLOSURE OF THE INVENTION

The present invention comprises Schottky Barrier Metal Oxide Semiconductor (MOS) devices and systems as well as recommended fabrication procedures therefore. The present invention is based in the fact that certain metals and compounds, (eg. silicides), etc. form rectifying Schottky barrier junctions with both N and P-type semiconductor, and that a gate voltage applied to a Metal Oxide Semiconductor (MOS) device can effect an accumulated, a depleted or an inverted surface channel region in a semiconductor surface, (that is, the effective doping type, (N, P and Intrinsic), of said semiconductor in said channel region can be controlled by application of a gate voltage). A Schottky barrier junction in a channel region then can be made to demonstrate rectifying properties, in opposite voltage polarity directions when a gate voltage is applied to effect, or not, a (MOS) semiconductor surface channel region doping type. As well, application of a gate voltage in a (MOS) device can, by controlling an effective semiconductor channel region doping level, (eg. number of carrier-per-centimeter-cubed), affect reverse bias current flow through a reverse biased Schottky barrier junction adjacent to said doping level controlled semiconductor channel region; and in a Metal Oxide Semiconductor Field Effect (MOSFET) Transistor device fabricated with Schottky barrier source and drain junctions, cause (MOSFET) drain current to vary with applied gate voltage. The present invention utilizes rectifying Schottky barrier junctions and also utilizes semiconductor region accessing Schottky barrier, (that is semiconductor-nonsemiconductor component), junctions which demonstrate essentially non-rectifying behavior as a result of being formed on, for instance, heavily doped semiconductor. Said essentially non-rectifying junctions provide nonrectifying electrical access to semiconductor regions.

Colaterally, the present invention also recognizes prior art disclosures to the effect that Schottky barrier junctions in (MOSFET) devices demonstrate two defects, these being high leakage current and, that typically, high resistance gaps exist between a Schottky barrier (MOSFET) source or drain and semiconductor channel region under a gate. As a solution thereto the present invention teaches etched, (preferably isotropic so as to undercut gate oxide), surface semiconductor regions at the ends of semiconductor channel regions, in which etched surface semiconductor regions small cross sectional area Schottky barrier junctions are present only in semiconductor regions at the ends of said semiconductor channel regions. Said result is accomplished by use of semiconductor protecting insulator material, (eg. Silicon dioxide where silicon is utilized), to cover and prevent Schottky barrier formation in etched surface semiconductor regions, other than at the ends of semiconductor channel regions.

In one embodiment, the present invention assumes the presence of a silicon substrate in which are present alternating N and P-type doped regions in a checkerboard pattern, similar to that required for fabrication of conventional Complimentary Metal Oxide Semiconductor (CMOS) device systems, (see Background Section), fabricated using diffused rectifying junction technology. Atop said silicon substrate surface there is caused to be present an insulating material, such as, but not limited to, thermally grown or deposited silicon dioxide and/or silicon nitride etc., into which insulating material are caused to be formed patterns above both said N and P-type regions. Said patterns typically consisting of two openings each, each of which openings is delineated by remaining insulating material, said insulating material between two associated openings being a gate insulating material above a silicon channel region, said channel region being wholly present in either an N or P-type silicon region. Said openings, at a minimum, provide access to the upper surface of the silicon under said insulating material, and alternatively can comprise an etching into said silicon so that silicon walls are formed at the edges of said openings under the insulating material, and perhaps undercut said insulating material as the result of an isotropic silicon etch. Atop said insulating material and atop said silicon in the openings of said patterns, there is caused to be present metal and/or a metal-silicide, (typically by vacuum evaporation or sputtering techniques), which when processed, (typically by an elevated temperature anneal), causes said metal and/or metal-silicide in contact with said silicon, (whether N or P-type), to form rectifying Schottky barrier junctions with said N and P-type silicon simultaneously. It is noted that line-of-sight deposition of a metal-silicide into etched silicon regions might be more appropriate when very small dimension devices are fabricated, (see first fabrication procedure supra). This is because formation of a silicide from a metal deposited upon a semiconductor can involve significant, (eg. hundreds to thousands of angstroms), migration of metal atoms into the semiconductor. If a preformed metal-silicide is deposited onto a semiconductor, this effect might be greatly reduced because a lower temperature and/or shorter anneal time, for instance, can serve to form rectifying junctions between said deposited metal-silicide and semiconductor. However, removal of deposited silicide in areas where it is unwanted can be difficult.

While not limiting, it has been found experimentally that a workable single mask/single etch fabrication procedure for realizing the above described (CMOS) device system is as follows:

1. Provide a silicon substrate, (typically, but not necessarily, of (100) crystal orientation), with alternating N and P-type regions, (each typically doped ten-to-the-fifteenth per-centimeter-cubed), present therein.

2. Grow silicon dioxide atop said substrate to a depth suitable for use as a gate oxide in a (MOSFET), (typically but not necessarily six-hundred (600) to three thousand (3000) angstroms).

3. Apply photoresist to the surface of said silicon dioxide.

4. Expose said photoresist through a mask which causes two openings to be effected therein over each N and P-type region, each of which openings is surrounded by silicon dioxide, with the silicon dioxide between each two associated openings being a gate oxide above a silicon channel region.

5. Etch the silicon dioxide, preferably anisotropically, to the surface of the silicon and then continue to isotropically etch into said silicon to a depth of hundreds of angstroms to one (1) micron or more. (Note that an isotropic silicon etch will undercut the silicon dioxide laterally a length approximately equal to the depth to which said silicon is etched perpendicular to the surface of the silicon substrate. This helps effect discontinuous metal or metal-silicide deposition in step 7 supra).

6. Remove said photoresist, preferably by an asher system in which plasma activated oxygen molecules effectively burn said photoresist away.

7. Deposit metal and/or metal-silicide by a line-of-sight method so that it is present atop the silicon dioxide and atop the resulting open surface of said silicon, in a discontinuous, device self-delineating, manner. A workable depth in the case where chromium is utilized is eight-hundred (800) angstroms wherein, a step 6 isotropic silicon etch depth of one (1) micron or more is utilized. However, it is noted that said examples are not to be considered limiting of the invention.

8. Process, (typically but not necessarily by an elevated temperature anneal), the resulting substrate so that rectifying Schottky barrier junctions are simultaneously formed between said metal or metal-silicide and said silicon with which said metal or metal-silicide is in contact, in both N and P-type silicon regions. It has been found experimentally that a four-hundred-fifty (450) degree centigrade, thirty (30) minute vacuum anneal works well when chromium is utilized. Again, said example is not to be considered limiting of the invention.

9. Remove unwanted remaining unreacted silicide forming metal with an etchant.

It should be appreciated that the recited procedure can, in a relatively few fabrication procedure steps result in self-delineated N and P-Channel (MOSFETS) being simultaneously formed on the processed silicon substrate in P and N-type silicon regions respectively. To then form (CMOS) it is only necessary to electrically interconnect the drain of a device formed in one type, (eg. N or P-type), of silicon to the drain of a device formed in the other type, (eg. P or N-type), silicon. The sources of each such resulting pair of (MOSFET) devices can then be connected to appropriate external source(s) of constant potential electrical voltage, and gate-to-source voltages applied to the metal and/or metal silicide atop the silicon dioxide in the channel regions to control the voltage present at said electrically connected drains. Said recited procedure might be best suited to fabrication utilizing line of sight deposition of silicides where discontinuous deposition, that atop the silicon dioxide and that atop the silicon in the source and drain regions, can be achieved.

As a variation on the above recited procedure one can, in step 5 thereof, cause an opening in silicon dioxide in an N-type region and an opening in a P-type region to be merged into a single opening, thereby effecting natural connection of the drain of one device with the drain another. The remaining openings from each pair of openings will then serve as the sources for connection to external source(s) of electrical voltage. The difference in the presently described embodiment is that the electrical connection of the drain regions of N and P-Channel devices straddles the junction between associated N and P-type regions in contact with said silicon in said N and P-type regions, rather than by a means which provides insulation from the silicon substrate at said electrical connection point.

An etch and metal deposition as described in the article by Hogeboom and Cobbold cited in the Background Section, but in which the silicon substrate contains both N and P-type regions, and in which the metal deposited, however, is chromium, followed by an anneal at four-hundred-fifty (450) to five-hundred (500) degrees centigrade for thirty (30) minutes to simultaneously form Schottky barrier junctions in both N and P-type silicon regions, can cause simultaneous formation of operable N and P-Channel (MOSFET) devices which can be electrically connected to provide (CMOS) device systems. It is mentioned that while Hogeboom and Cobbold describe use of a wet acid etch to provide an isotropic silicon etch to undercut the silicon dioxide, a more controlable, (the etchant taught in the Hogeboom and Cobbold article has been found to etch silicon at approximately three-thousand 3000 angstroms a second), and hence, perhaps preferable approach involves use of dry plasma anisotropic etching of silicon dioxide using CF4 gas, (perhaps with a bit of hydrogen added thereto), at low pressure, (eg. a militorr) and relatively high plasma energy, to provide silicon dioxide walls at the edges of the etched patterns which are essentially perpendicular to the silicon surface, followed by an elevated pressure, (eg. hundreds of militorr), reduced plasma power isotropic plasma etching of the silicon using CF4 gas with added oxygen (eg. five (5%) percent), to provide a an etched silicon which undercuts the silicon dioxide. As mentioned, undercutting said silicon dioxide aids achieving discontinuous metal or metal-silicide deposition. This can be important where chromium is deposited as it tends to adhere to the silicon dioxide edge. Where chromium deposition is by sputtering, it has even been found that chromium is deposited on the silicon beneath the undercut silicon dioxide. This effect can be used advantageously, however, (see supra).

Continuing, while the above recited fabrication method is workable, it has been found that it is highly dependent upon the silicide forming metal deposition step. That is, if the silicide forming metal, or silicide, deposition is not by a line-of-sight technique, (ionized cluster deposition would be a preferred approach), said silicide forming metal tends to cover the entire substrate, even under an undercut silicon dioxide, and cause a short between the drain and source. An alternative fabrication procedure which does not require such stringent control of the silicide forming metal deposition step, hence, which is preferred, is as follows:

1. Provide a silicon substrate, (typically, but not necessarily, of (100) crystal orientation), with alternating N and P-type regions, (each typically doped ten-to-the-fifteenth per-centimeter-cubed but not limited thereto), present therein.
2. Grow silicon dioxide atop said substrate to a depth suitable for use as a gate oxide in a (MOSFET), (typically but not necessarily six-hundred (600) to three (3000) thousand angstroms).
3. Deposit a layer (eg. five-thousand (5000 Angstroms or more), of gate forming metal, (eg. Chromium or preferably Aluminum), atop said Silicon Dioxide.
4. Apply photoresist to the surface of said layer of gate forming metal.
5. Expose said photoresist through a mask which causes two openings to be effected therein over each N and P-type region, said openings corresponding to Source and Drain regions with the space therebetween between being a channel region in the Silicon beneath the Silicon Dioxide and layer of gate forming metal.
6. Etch the layer of gate forming metal and silicon dioxide, preferably anisotropically, to the surface of the silicon and optionally continue to etch into said silicon to a depth of hundreds of angstroms to one (1) micron or more.
7. Remove said photoresist, preferably by an asher system in which plasma activated oxygen molecules effectively burn said photoresist away.
8. Deposit a layer of silicide forming metal, so that it is present atop the layer of gate forming metal deposited in Step 3 and atop the surface of said silicon opened in step 6, (note that said metal can be the same or a different metal than that deposited in step 3).
9. Process, (typically but not necessarily by an elevated temperature anneal), the resulting substrate so that rectifying Schottky barrier junctions are simultaneously formed between said layer of silicide forming metal and said silicon with which said layer of silicide forming metal is in contact, in both N and P-type Source and Drain silicon regions. It has been found experimentally that a four-hundred (400) to five-hundred (500) degree centigrade, thirty (30) minute vacuum anneal, works well when Chromium is the Schottky barrier rectifying junction forming silicide forming metal deposited in step 8. Again, said example is not to be considered limiting of the invention.
10. Perform an etch to remove the any remaining silicide forming metal deposited in Step 8, which did not form a silicide. This removes all such silicide forming metal from the edges of the Silicon Dioxide which was etched in Step 6. The layer of gate forming metal deposited in Step 3 remains atop the gate silicon dioxide, thereby providing a delineated (MOSFET) structure.

A variation of the above device system, which does not require the presence of a checkerboard alternate doping pattern, requires but a few additional processing steps to achieve, provides a present invention preferred, embodiment, (ie. a single device equivalent to (CMOS), or alternatively described, a single MOS device with operating characteristics similar to multiple device (CMOS) diffused junction systems). To form a single device equivalent to (CMOS) an additional etch through the gate forming metal and silicon dioxide, or a functionally equivalent device geometry providing approach, can be performed to provide "mid-point" access to the channel region. It can be appreciated that if a (MOSFET) device system formed on a doped semiconductor has a voltage applied between the Schottky barrier junctions thereof, one Schottky barrier will be forward, and one reverse biased. If an inverted channel is caused to form in the (MOSFET) structure surface channel region by application of an appropriate voltage to the gate of said device, the forward biased Schottky barrier junction will become reverse biased, and the reverse biased Schottky barrier junction forward biased, in said channel region. This causes the voltage present in the channel region to vary essentially between that applied to the Schottky barrier junctions. That is, essentially the voltage applied to a forward biased Schottky barrier junction will appear at a channel accessing region. When this is done, unless the channel accessing region is small in size dimension so that a gate voltage effected fringing field effectively inverts the opened region, the channel accessing region silicon might be doped, (possible with N and P-type regions), to a depth of approximately one-hundred (100) Angstroms into the substrate so that reverse bias leakage current is increased, or so that a forward biased path exists regardless of semiconductor channel region doping type. This can be accomplished by additional processing steps prior to deposition of aluminum in the second fabrication procedure described above. It is possible, to avoid this complication, to form such a single device equivalent to (CMOS) using intrinsic semiconductor, in which applied gate voltage only controls the effective doping in a channel region, and the forward/reverse bias state of two Schottky barrier junctions, situated in reverse back to back order as in the (MOSFET) described above. Such devices fabricated on intrinsic silicon tested have been found to be operable by the Inventor/Applicant. A particularly surprising result was discovered in devices formed on intrinsic silicon. That being that application of drain to source voltage, without a like polarity gate to source voltage being applied, causes no mid-point channel accessing voltage to appear. It is also mentioned, and is better described in the Detailed Description Section of this Disclosure, that the single device equivalent to (CMOS) fabrication procedure described supra provides an non-inverting embodiment. That is application of a gate voltage effects a voltage at channel accessing region to increase. An inverting version of the single device equivalent to (CMOS) is realized by causing the channel accessing region to have rectifying Schottky Barrier junctions present, rather than non-rectifying, and the source and drain regions to have non-rectifying junctions thereto rather than rectifying Schottky barrier junctions. This is better described in the Detailed Description Section of this Disclosure.

It is also mentioned that the voltage which appears at the mid-point channel accessing region is a result of applied drain to source and gate to source voltages. As a result the described devices can be utilized as modulators.

In addition, it is disclosed that if no voltage is applied to the drain, (or the drain is electrically interconnected with the source), but a voltage is applied to the non-rectifying contact at the mid-point channel accessing region with respect to said source, such that the Schottky barrier source is reverse biased then only a small reverse bias leakage current will flow through said Schottky barrier source, (and possibly drain if it is electrically interconnected to the source), junction. However, if a gate voltage induced inverted semiconductor channel region is caused to form, a forward biased current can flow through the source (and possibly drain). Configured as such, the device is a voltage controlled switch, functionally similar to a Silicon Controlled Rectifier (SCR) which does not latch. That is, said voltage controlled switch is turned on and off by simultaneous application of gate voltage. Said device can also be operated as a gate voltage controlled direction of rectification device. That is, it will conduct forward biased in one direction when the semiconductor is, under the control of an applied gate voltage, caused to be effectively N-type and the opposite direction when the semiconductor is effectively P-type. Of course, the present invention systems can be achieved by other than the example procedures.

It is also noted that a common problem in Schottky barrier (MOSFETS) is the presence of relatively high leakage current. A slightly modified approach to fabrication Schottky Barrier devices serves to provide devices in which the rectifying junction is present only at the facing ends of a semiconductor channel region. Said fabrication comprises:

1. Providing a silicon substrate;
2. Growing silicon dioxide atop the surface thereof;
3. Etching through said silicon dioxide and into said silicon, a pattern comprising a (MOSFET) Source and Drain separated by a semiconductor channel region;
3a. Depositing a layer of silicon protecting material such as silicon nitride and etching a pattern therein such that it remains at the ends of the channel region in the silicon.
4. Growing a layer of insulating silicon dioxide atop the etched open silicon regions;
4a. Removing remaining silicon protective material to provide access to silicon at the ends of said silicon channel region and proceeding directly to Step 6.
5. Etching said layer of insulating silicon dioxide to open the silicon in the etched silicon regions only at positions adjacent to the Source and Drain at the ends of said channel region in said silicon;
6. Depositing a layer of silicide forming metal over the resulting substrate surface, preferably by a non-line-of-sight approach such as sputtering;
7. Processing the resulting system so that Schottky barrier junctions form between the deposited silicide forming metal and the opened silicon in the Source and Drain regions at the facing ends of said channel in the silicon;
8. Etching away remaining unreacted silicide forming metal;
9. Depositing conductor metal over the resulting substrate surface, (eg. aluminum); and
10. Etching said conductor metal to form isolated Source, Drain and Gate.

An additional etch through the gate and silicon dioxide in the channel region can also be performed to provide a single device equivalent to (CMOS) and voltage controlled switch/ direction of rectification device structure as described infra.

Steps 3a. and 4a identify an alternative, and actually preferred, approach which can be utilized to effect Schottky barrier junctions at the ends of a semiconductor channel region, by depositing silicon protective material, (eg. silicon nitride), and etching patterns therein to allow silicon dioxide growth except at the ends of a channel region,-then removing the silicon protecting material with non-silicon dioxide etching means. This can serve to protect the shape of an undercut silicon dioxide where a silicon dioxide etch to open silicon channel ends, (as in Step 5. above), would alter such.

The above devices are better described in the Detailed Description Section of this Disclosure in conjunction with the Drawings.

Metals other than chromium and aluminum can also be utilized, but care must be exercised to assure that said metal does not adversely interact with a present insulating material. For instance, vanadium, titanium, niobium, and zirconium are reported to adversely react with silicon dioxide whereas chromium, molybdenum and tungsten do not. In particular, aluminum is a very safe metal to use as gate metalization material and is preferred. (Note that a preferred Chromium etchant comprising a mixture of cerric ammonium nitrate, (eight (8) grams), and perchloric acid, (three (3) milliliters), in deionized water, (forty (40) milliliters), does not noticeably attack Aluminum for many hours after contact therewith, thereby making Aluminum particularly attractive). As well, Aluminum easily withstands a five-hundred (500) degree centigrade silicide forming anneal temperature procedure.

Continuing, Schottky barriers of similar barrier heights on N and P-type silicon are desirable and the Schottky barriers should be formed on N and P-type silicon simultaneously whether metal and/or metal-silicide is provided during a reasonable process, such as an elevated temperature anneal in the range of five-hundred, (500), degrees centigrade or less. As well, many metal-silicon reactions provide numerous phases, (eg. titanium, iron, cobalt, nickel, rubidium, lead, hafnium, iridium, and platinum), whereas vanadium, chromium, zirconium, niobium, molybdenum, tantalum and tungsten form only a single disilicide phase with silicon. As thin film silicide formation driving forces are not well understood at the present time, a single phase formation is desirable as it reduces complications during a fabrication procedure.

Chromium-disilicide provides a documented Schottky barrier height on N-type silicon of 0.57 ev with an apparently essentially balanced similar barrier height on P-type silicon. Similar results are reported in the literature where Molibdinum Disilicide, Vanadium Disilicide Vanadium and Titanium Disilicide are present. Dipaladium silicide provides 0.75 ev on N-type silicon. Diplatinum silicide, provides 0.79 ev and Platinum silicide 0.88 ev, again on N-type silicon. Platinum Silicide provides 0.24 ev on P-type silicon. Elements which form silicides with Schottky barrier heights on N-type silicon similar to that of chromium are molybdenum with molybdenum disilicide providing 0.55 ev, tantalum with tantalum disilicide providing 0.59 ev, titanium with titanium disilicide providing 0.61 ev and zirconium with zirconium disilicide providing 0.55 ev. Cobalt silicide and cobalt disilicide each provide 0.65 ev. Eridium disilicide and gadnium disilicide each provide 0.38 ev. Rhubideum silicide provides 0.69 ev and tungsten disilicide provides 0.65 ev.

In view of the above, and in view of the fact that molybdenum is known to have a temperature expansion coefficient similar to that of silicon, molybdenum, as well as chromium, is a particularly suitable metal for use in realizing the present invention. Tungsten is also be particularly suitable, although its Schottky barrier height on N-type silicon might be a bit high.

It is also to be noted that transition metal-silicide formation is generally uniform, but that yttrium, rhubideum, paladium iridium and hafnium do not provide uniform silicide layers. It is believed that silicide formation is nucleation controlled and that this leads to interfacial nonuniformities which are more severe than for non-nucleation controlled transition metal silicide formation, (that is for diffusion or reaction controlled metal silicide formation).

Other considerations involve comparability of a Schottky barrier metal or metal-silicide with aluminum which is typically used as interconnecting trace metal in integrated circuits. For instance it has been reported that when aluminum in contact with platinum or paladium is annealed at two-hundred-twenty-five (225) and two-hundred-fifty (250) degrees centigrade respectively, voids and thickenings are observed. Said effect is reported to be less pronounced when tantalum, chromium, molybdenum and cobalt are used. (See Colgan, "Aluminum-Transition Metal Thin Film Reactions", Ph.D. thesis, Cornell, 1987 and J. Appl. Phys., 62(4), 1224, 1987). It is noted that the information provided above regarding silicides was gleened primarily from the book titled "Electronic Materials Science", by Mayer & Lau, MacMillan Publishing, 1990.

It is further disclosed that the source or drain of a Schottky barrier (MOSFET) device fabricated on P-type or N-type semiconductor can be electrically connected to the source or drain of a second (MOSFET) fabricated on P-type or N-type semiconductor to form a (MOSFET) transistor with a (MOSFET) load and seriesed (MOSFETS). In addition, the sources of two (MOSFET) devices formed on P-type (or N-type) semiconductor can be electrically connected to one another to form balanced differential (MOSFET) systems such as are present in differential amplifiers. In addition, certain Schottky barriers can be caused to form on relatively highly doped regions of semiconductor, thereby effecting essentially non-rectifying junctions. As mentioned above, the present invention enables fabrication of single device equivalents to (CMOS) and voltage controlled switches. All such Schottky barrier (MOSFET) device systems are to be considered within the scope of the present invention.

The present invention will be better understood by reference to the Detailed Description Section of this Disclosure in conjunction with the accompanying Drawings.

SUMMARY OF THE INVENTION

Conventional Metal Oxide Semiconductor Field Effect Transistors (MOSFETS) are well known. Fabrication thereof utilizes diffused junction technology to create required rectifying junctions at the ends of a substrate surface channel region in a semiconductor substrate, and requires a relatively large number of fabrication steps. As each step in a fabrication procedure introduces defects to devices being fabricated, a process for fabricating (MOSFET) devices which requires a reduced number of fabrication steps provides utility. An alternative to diffused junction technology for creating rectifying junctions is that of Schottky barrier junction technology. The present invention teaches that Schottky barrier junction technology can be successfully applied to fabrication of rectifying junctions suitable for use in (MOSFETS). In addition, the present invention demonstrates that said Schottky barrier junction technology is applicable to simultaneous fabrication of (MOSFETS) on both N and P-type silicon when chromium is deposited thereupon and annealed thereto. The present invention thus teaches and demonstrates that Schottky barrier junction technology is applicable to the fabrication of Complimentary Metal Oxide Semiconductor Field Effect Transistor (CMOST) device systems, wherein N and P-channel (MOSFET) device drains are electrically interconnected to one another.

The present invention also teaches Schottky barrier (MOSFET) device systems comprised of Schottky barrier (MOSFETS) as described above, but in which two Schottky barrier (MOSFET) devices formed on N-type silicon, or two Schottky barrier (MOSFET) devices formed on P-type silicon have the source of one Schottky barrier (MOSFET) device electrically interconnected to the drain of the other, or have the sources of Schottky barrier (MOSFET) devices electrically interconnected. Said device system configurations being Schottky barrier (MOSFET) transistor with a Schottky barrier (MOSFET) load and seriesed Schottky barrier (MOSFETS), or balanced differential Schottky barrier (MOSFET) systems respectively.

As well, and significantly, the present invention teaches the application of essentially non-rectifying as well as rectifying Schottky barrier junctions in (MOS) based non-inverting and inverting single (MOS) devices, fabricated on a single semiconductor type, which single (MOS) devices provide operating characteristics similar to multiple device (CMOS) systems. Said single (MOS) devices can also be configured as voltage controlled switches with operating characteristics similar to a non-latching Silicon Controlled Rectifier (SCR). Said devices can also be operated as modulators with an output voltage being dependent on both applied drain to source and gate to source voltages, and as gate voltage controlled direction of rectification devices.

The present invention also teaches the use of intrinsic silicon in realization of single inverting and non-inverting devices with operating characteristics similar to multiple device (CMOS) systems.

Low leakage current structure devices are achieved by use of an insulating material which serves to limit the surface area of Schottky barrier junctions to just that necessary to provide current to a semiconductor channel region, at the ends thereof.

It is therefore a purpose of the present invention to teach a Schottky barrier (CMOS) device system comprising two metal-N-type and/or metal-silicide-N-type semiconductor rectifying junctions separated by a first channel region, in functional combination with two metal-P-type and/or metal-silicide-P-type semiconductor rectifying junctions separated by a second channel region.

It is another a purpose of the present invention to teach a Schottky barrier (MOSFET) device system comprising two metal-N-type and/or metal-silicide-N-type semiconductor rectifying junctions separated by a first channel region, in functional combination with two metal-N-type and/or metal-silicide-N-type semiconductor rectifying junctions separated by a second channel region.

It is yet another a purpose of the present invention to teach a Schottky barrier (MOSFET) device system comprising two metal-P-type and/or metal-silicide-P-type semiconductor rectifying junctions separated by a first channel region, in functional combination with two metal-P-type and/or metal-silicide-P-type semiconductor rectifying junctions separated by a second channel region.

It is yet still another purpose to teach a single device Schottky barrier (MOS) system, fabricated on a single type semiconductor substrate, which provides operating characteristics similar to multiple device (CMOS) systems fabricated on multiple semiconductor types.

It is still yet another purpose to teach that a single device Schottky barrier (MOS) system, fabricated on a single type semiconductor, which provides operating characteristics similar to multiple device (CMOS) systems, and which can be operated as a modultor.

It is a further purpose of the present invention to teach a Schottky barrier (MOS) voltage controled switch, fabricated on a single type semiconductor, which provides operating characteristics similar to a non-latching Silicon Controlled Rectifier (SCR) and can be operated as a gate voltage controlled direction of rectification device.

It is yet a further purpose of the present invention to teach suitable fabrication procedures for Schottky barrier (MOS) device systems, which fabrication procedures require a lessor number of defect introducing fabrication steps, as compared to fabrication schemes utilizing diffused junction technology.

It still yet a further purpose of the present invention to teach the use of intrinsic silicon in realization of single inverting and non-inverting devices, fabricated on a single type semiconductor, which single inverting and non-inverting devices demonstrate characteristics similar to multiple device (CMOS) systems and can be operated as a modulator, a nonlatching (SCR) and/or a gate voltage controlled direction of rectification device.

It is another purpose of the present invention to disclose experimentally obtained results which demonstrate operational characteristics of Schottky barrier technology derived (MOSFET) devices fabricated by a disclosed fabrication procedure.

It is yet another purpose of the present invention to teach a low leakage current Schottky barrier (MOSFET) device structure which provides Schottky barrier junctions only at the ends of a semiconductor channel region, and a fabrication procedure for realization thereof.

BRIEF DESCRIPTION OF THE DRAWINGS

FIGS. 9(a) through 9(j) show a silicon substrate at various stages of fabrication of (MOSFET) devices using a preferred fabrication process.

FIGS. 9(k) through 9(m) show structures similar to those shown in FIGS. 3 and 4, but fabricated by the preferred fabrication method demonstrated by FIGS. 9(a) through 9(k).

FIGS. 11(ao) through 11(go), 11(a1) through 11(g1), 11(a2) through 11(g2p), and 11(a3) through 11(g3) show fabrication steps utilized in arriving at a low leakage Schottky barrier junction.

FIGS. 11(ha), 11(hb), 11(i), 11(j) and 11(k) show various (MOSFET) geometries incorporating low leakage current Schottky barrier junctions.

FIGS. 11(l), 11(m), 11(n) and 11(o) show various geometries for single device equivalents to (CMOS) incorporating low leakage current Schottky barrier junctions.

FIGS. 12(a) and 12(b) show circuit symbols for conventional diffused junction P-Channel and N-Channel (MOSFETS).

FIGS. 13(a) and 13(b) show circuit symbol representations for conventional diffused junction and for Schottky barrier (MOSFET) (CMOS) systems.

FIG. 14 shows circuit symbols for a balanced pair of Schottky barrier (MOSFETS) such as can be used in operational amplifiers.

FIGS. 15(a) and 15(b) show active Schottky barrier (MOSFETS) with (MOSFET) loads. Active devices are shown as N-Channel but P-Channel (MOSFETS) could also be used.

DETAILED DESCRIPTION

Figure 1A:
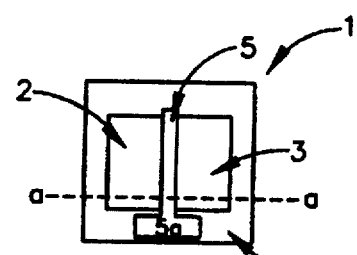
FIG. 1(a) shows a top view of a conventional (MOSFET).
Figure 2A:
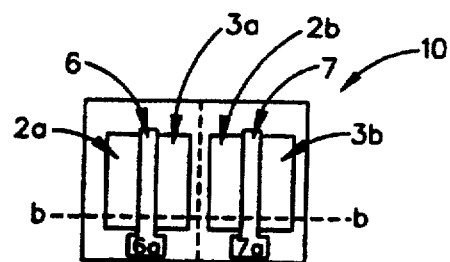
FIG. 2(a) shows a top view of a conventional (CMOS) device system.
Figure 1B:
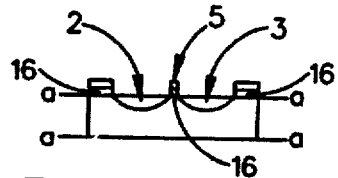
FIG. 1(b) shows a side cross-sectional view of a conventional (MOSFET) taken at a—a in FIG. 1(a).
Figure 2B:
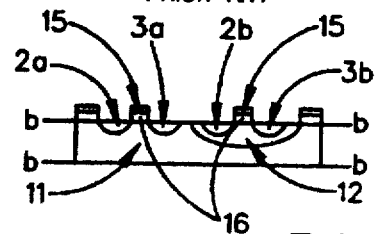
FIG. 2(b) shows a side cross-sectional view of a conventional (CMOS) device system taken at b—b in FIG. 2(a).

Turning now to the Drawings, there is shown in FIGS. 1a and 1b a conventional diffused junction silicon substrate (MOSFET) (1). Shown are a silicon substrate (4) of N or P-type doping with oppositely doped diffused source (2) and drain (3) regions present therein. Shown as well are gate (5) and gate pad (5a), with silicon dioxide (16) present between said gate (5) and a semiconductor channel region thereunder between said source (2) and drain (3). FIGS. 2a and 2b show a (CMOS) device system (10) comprising a substrate with regions of N (11) and P-type (12) doping. Diffused source (2a) and (3b) and diffused drain (3a) and (2b) regions, of opposite type doping with respect to the type of substrate respectively with which they are associated, are shown on each of the N (11) and P-type (12) regions. Also shown are gates (6) and (7) and gate pads (6a) and (7a). During use gates (6) and (7) can be electrically interconnected, and drain (3a) can be electrically interconnected to drain (2b). Source (2a) can be connected to an external positive voltage (+Vdd) and source (3b) connected to external voltage (−Vss) which is typically ground. When a relatively low gate voltage is simultaneously applied to the electrically interconnected gates (6) and (7) the P-channel (MOSFET) on the N-type silicon (11) will have an inverted P-type channel region formed between its source (2a) and drain (3a), hence will provide a reduced resistivity therebetween. The (MOSFET) on the P-type (12) silicon will have an accumulated channel region and will continue to demonstrate a high resistivity. (Note that as used herein the term "inversion" means that a gate induced electric field causes silicon type to reverse in a channel region and the term "accumulation" means that a gate induced electric field causes a silicon type to become more so said type, (eg. N or P-type) in a channel region). The voltage applied to the source (2a) will therefore appear at the electrical connection between drain (3a) and drain (2b). It should be appreciated that application of a relatively high gate voltage, (eg. approximately Vdd), will cause the voltage applied to the source (3b) to appear at the electrical connection point between drain (3a) and drain (2b). That is, a low resistivity inverted channel will form in the N-channel device formed on the P-type (12) silicon while the P-channel device formed on the N-type (11) silicon will demonstrate accumulated channel high drain (3a) to source (2a) resistivity. As the gate oxide is of a high resistance, (eg. ten-to-the-forteenth ohms), little gate current is required to switch the identified voltage at the electrical connection between drain (3a) and drain (2b). Also, as one of the devices is nearly always off during operation, except momentarily at the point of switching, very little source (2a) to source (3b) current flows. It should then be appreciated that the (CMOS) device system is very energy efficient. (CMOS) devices systems then allow applied gate voltage control of the voltage present at an essentially electrically isolated terminal.

Figure 3:
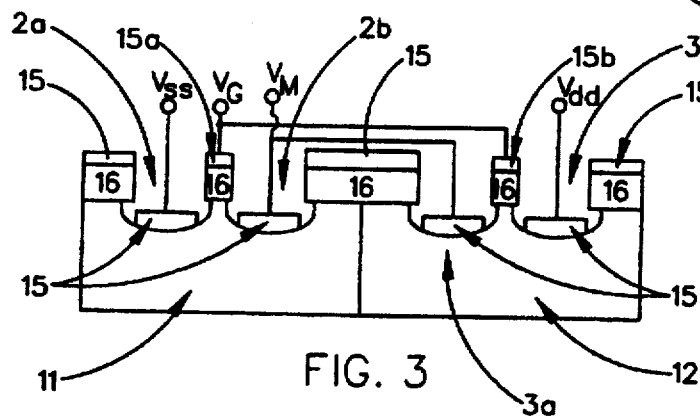
FIG. 3 shows a side cross-sectional view of a Schottky barrier (MOSFET) device system of the present invention.
Figure 5:
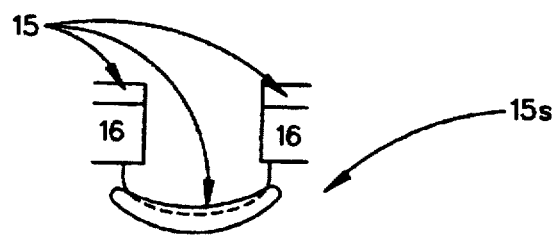
FIG. 5 demonstrates the formation of a metal-silicide when a metal which has been deposited upon a semiconductor substrate is annealed.

Turning now to FIG. 3, there is shown a (CMOS) device system appropriate to the present invention. Both N (11) and P-type (12) doped regions are shorn in a silicon substrate. Shown also are silicon dioxide (16), gates (15a) and (15b), sources (2a) and (3b) and drains (2b) and (3a) with metal (15) present, said metal (15) being discontinuous between that atop the silicon dioxide (16) and atop the N-type (11) and P-type (12) silicon. The gates (15a) and (15b) are shown electrically interconnected as are drain (2b) and drain (3a). FIG. 5 demonstrates that an anneal of metal (15) in contact with silicon can cause formation of a silicide (15s) at the metal-silicon interface or otherwise effects a Schottky barrier rectifying junction, between said metal (15) and said silicon. This is the case whether the silicon is N (11) or P-type (12), when for instance, the metal is chromium or molybdinum. FIG. 5 demonstrates that a Schottky barrier is comprised of semiconductor and nonsemiconductor components. Also, though not explicitly shown it is to be understood that said silicide can form laterally, into a channel region under a gate (15a) (15b), as well as vertically into a semiconductor substrate.

Figure 4:
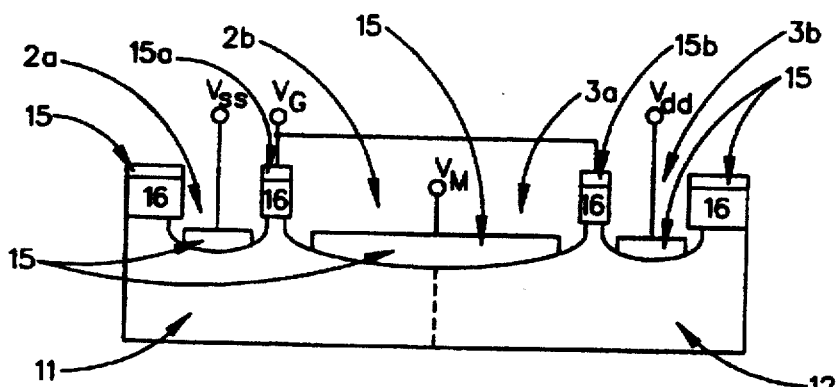
FIG. 4 shows a side cross-sectional view of a modified Schottky barrier (MOSFET) device system of the present invention.

It should be appreciated that deposition of metal (15) upon a substrate etched as demonstrated in FIG. 3 can provide a self delineated (CMOS) device system if the metal deposited is not too thick and deposited by a line-of-sight technique, and it forms a silicide with silicon when annealed thereto. FIG. 4 shows a variation in which the oxide is removed between drain (2b) and drain (3a) providing immediate electrical interconnection therebetween.

Figure 6:
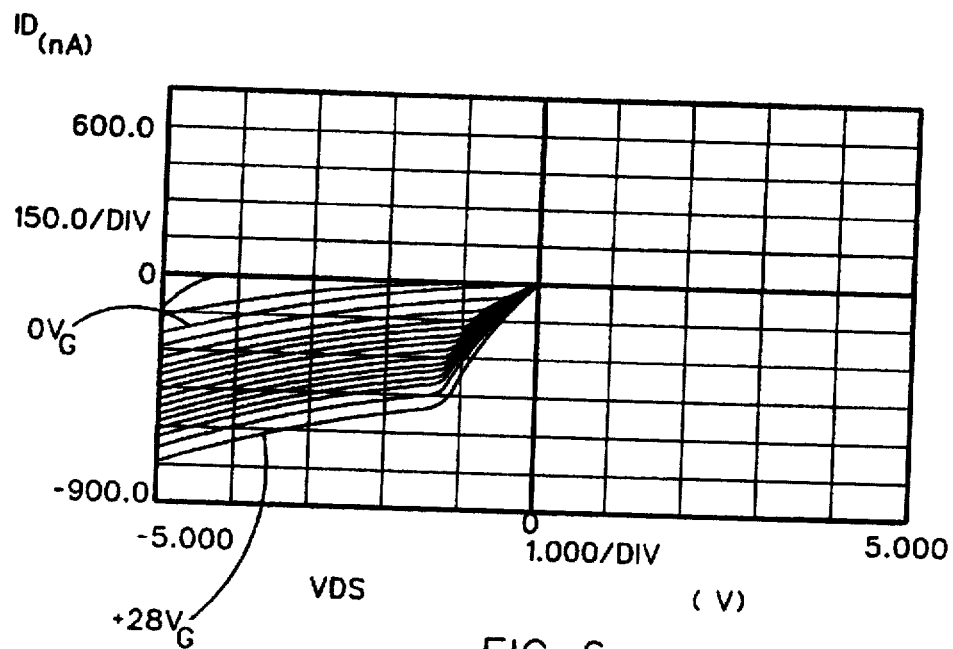
FIG. 6 shows (MOSFET) drain-current vs. drain-to-source voltage curves, as a function of gate-to-source voltage, provided by a device formed on P-type silicon wherein chromium was deposited in drain and source regions and annealed thereto.
Figure 7:
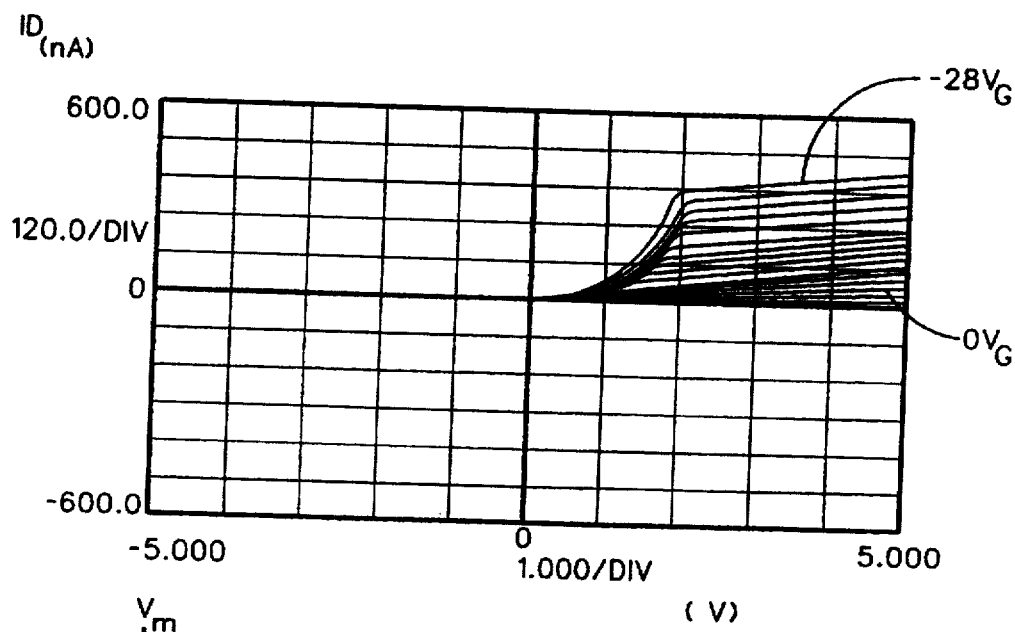
FIG. 7 shows (MOSFET) drain-current vs. drain-to-source voltage curves, as a function of gate-to-source voltage, provided by a device formed on N-type silicon wherein chromium was deposited in drain and source regions and annealed thereto.

The drain-current vs. drain-to-source-voltage operational curves of N-Channel and P-Channel, respectively, devices as shown in FIGS. 6 and 7 are similar to those of normal (MOSFETS), with the exception that drain current flows in a direction opposite to that in conventional (MOSFETS). (Note that the parameter analyzer provides output data indicating the drain voltage as negative or positive with respect to the source, which is held at ground potential. However, as the tested Schottky Barrier (MOSFETS) are geometrically symetrical with regard to the drain and source relation to the gate, (see FIGS. 1–4 to appreciate such symetry), the devices will work just as well if the source is biased with respect to a common point drain). Insight as to how said Schottky barrier (MOSFETS) might operate is provided in the Lepselter and Sze paper referenced in the Background Section. Briefly, said article considers that the source region junction of a P-channel device formed on N-type silicon, using platinum as the metalization, is reverse biased during operation and that it is reverse leakage or tunneling current which is modulated by the applied gate voltage. This article states that it was the source which was reverse biased during operation. In addition, with respect to FIG. 13b herein, which shows a Schottky barrier (MOSFET) (CMOS) configuration, it will be appreciated that it is the source of N-Channel and P-Channel devices which are reverse biased during operation. Designation of source and drain are then, dependent upon position within a circuit.

Reference to FIGS. 6 and 7 show that N and P-channel (MOSFET) devices fabricated on P and N-type silicon respectively by the inventor herein, using eight-hundred (800) angstroms of chromium as the metalization, which chromium was simultaneously vacuum deposited on both N (11) and P-type (12) silicon and then simultaneously vacuum annealed to said N (11) and P-type (12) silicon at four-hundred (400) degrees centigrade for thirty (30) minutes, provide (MOSFET)-type operational drain-current vs. drain-to-source voltage curves as a function of gate-to-source voltage. It is also disclosed that tested devices had a gate length and width of approximately ten (10) microns and seventy-five (75) microns respectively. It is noted that FIG.

6 drain-current vs. drain-to-source voltage curves for (MOSFET) devices, (as a function of gate-to-source volts), fabricated on P-type silicon (12) are in the third quadrant and the FIG. 7 drain-current vs. drain-to-source voltage curves for devices, (as a function of gate-to-source volts), fabricated on N-type expected by reference to the Lepselter et al. article. However it is noted that the present devices operate with the drain junction in each device reverse biased rather than the source junction, as is what the Lepselter and Sze article states was the case with their devices. It is noted and emphasized that the drain-current vs. drain-to-source voltage curves in FIGS. 6 & 7 are quite complimentary and nearly symetrical. These attributes are substrate doping dependent, (which doping levels were approximately equal at ten-to-the-fifteenth-per-cm-cubed) for the presently discussed FIGS. 6 and 7 represented N-Channel and P-Channel devices), which makes the devices which provided said drain-current vs. drain-to-source voltage curves quite appropriate for application in combined (CMOS) device systems. It is also noted that devices formed on both N (11) and P-type (12) silicon show a small drain current with zero (0.0) gate-to-source volts applied. This can be the result of "leaky" silicon dioxide or a function of substrate doping. That is, the zero (0.0) gate-to-source voltage drain current flow might be through the gate circuit or through the source circuit. In the former case a leaky oxide is the cause, and in the later a reverse bias Schottky barrier leakage or tunneling current is the cause. Superior oxide and varying substrate metalurgical doping levels can serve to adjust said current flow at zero (0.0) applied gate-to-source voltage drain current flow. Note that application of gate voltages of opposite polarities to those which serve to increase drain current flow serve to reduce said drain currents to essentially zero in the respective (MOSFET) devices formed on N and P-type silicon respectively. This shows depletion mode device operation is possible, but that the tested devices are primarily enhancement mode devices. (Note that "enhancement" means that increasing the absolute value of gate voltage causes an increase in drain current. Depletion mode means that an increase in the absolute value of gate voltage causes a decrease in drain current). It is also reported that the onset of drain current conduction in present fabricated tested N-Channel Schottky barrier (MOSFET) devices has been found to correlate very well with Capacitance-Voltage (CV) plot onset of channel inversion, (which occurs at approximately minus (-4.0) volts in N-Channel devices, leading to the proposal that positive ions in the oxide may account for a shifted threshold of conduction and the presence of zero (0.0) gate-to-source volts drain current flow rather than poor oxide or gate uninfluenced drain current flow. This would not explain a similar result in the presently fabricated and tested P-Channel devices however.

Continuing, of importance is the fact that (CMOS) operation can be effected by application of appropriate gate-to-source voltages because said current levels are small, essentially balanced and eliminated in each (MOSFET) device by application of a gate voltage which serves to increase the conductivity of the other present (CMOS) (MOSFET) device. In particular though, the present invention is not to be considered dependent on the presence of said zero (0.0) applied gate-to-source voltage, drain-to-source current flow shown in FIGS. 6 and 7. See FIGS. 8 and 13, and accompanying discussion for insight to (CMOS) operation.

Figure 8:
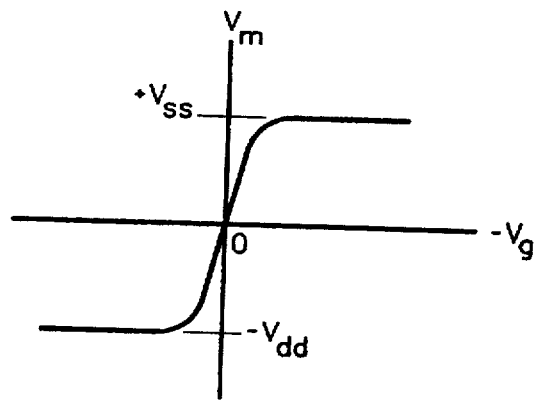
FIG. 8 shows (CMOS) curves such as provided by a seriesed combination of (MOSFET) devices, which provide drain-current vs. drain-to-source voltage curves as demonstrated in FIGS. 6 and 7.

Coupling drain (2b) and drain (3a) as described above to form a (CMOS) device system, and sequentially, but simultaneously, applying varying values of gate-to-source voltage to coupled gates (15a) and (15b) provides (CMOS) device system operational curves such as shown in FIG. 8. (See FIG. 13b for a circuit symbol representation thereof). FIG. 8 shows the voltage (Vm), (ie. voltage present at the electrical interconnection connection point of drain (2b) and drain (3a), switches between, essentially, that (Vss) applied to source (2a) and that (-Vdd) applied to source (3b) by external circuitry, when the gate voltage applied simultaneously to electrically interconnected device gates (15a) and (15b) is varied. (See discussion of FIG. 13a (supra) for insight as to conventional diffused junction (CMOS) system operation and of FIG. 13b (supra) for additional insight to operation of Schottky barrier (CMOS) system operation).

It is also possible to form a series combination of two, (N-channel or P-channel), (MOSFETS) to form transistor-load device systems or balanced differential (MOSFET) transistor pair systems. Such configurations can be N-channel device and N-channel load, P-channel device and P-channel load, N-channel device and P-channel load and P-channel device and N-channel load, (See FIGS. 15(a) and 15(b) and 14 for circuit symbol representations). In a transistor-load device system the source of one device is electrically interconnected to a drain of another and the gate of the load device is typically electrically interconnected to the lead on the load device not connected to the transistor. The gates of the transistor and load are not electrically interconnected and during use a voltage input signal is applied between the free transistor gate and its source, while a load voltage is applied between the electrically interconnected load gate and the lead on the load transistor not electrically interconnected with the transistor, and the source of the transistor. In a balanced differential (MOSFET) transistor pair system the sources of two (MOSFETS) devices are electrically interconnected and the gates of the so interconnected devices are not directly electrically interconnected, but rather attach across a source of voltage. Each (MOSFET) drain is also attached to a source of voltage which is referenced to the electrically interconnected sources, normally through a load, and application of a voltage difference between the gates of the two (MOSFET) devices effects a current flow through the drains. It should be appreciated that only the voltage difference between said gates has an effect on current through said balanced differential pair system drains. That is, common-mode voltage applied to both gates has no significant effect on current flow through the device system (MOSFET) drains. The present invention should be considered to include such configurations as the distinction therein is the type of silicon upon which two simultaneously fabricated electrically interconnected devices are formed. That is, instead of electrically interconnecting (MOSFET) devices formed on N and P-type silicon, two devices formed on N-type, or two devices formed on P-type, silicon are electrically interconnected. Referring to FIGS. 3 and 4, this would correspond to interpreting both semiconductor regions (11) and (12) to be of one type, (ie. N or P-type) to demonstrate a (MOSFET) with a (MOSFET) load, along with, typically, considering the shown common gate electrical connection as broken, and with an electrical connection added between the load device drain and gate, perhaps through a resistor. A simple seriesed (MOSFET) configuration is realized by electrically connecting a rectifying junction drain (2b) of one (MOSFET) to a rectifying junction source (3a) of another. As well, simply considering rectifying junctions (2b) and (3a) to be electrically connected sources and (2a) and (3b) to represent drains of devices formed in semiconductor regions (11) and (12) in FIGS. 3 and 4, provides pictorial representation of the balanced differential (MOSFET) pair configuration. As mentioned above, in such a balanced differential (MOSFET) pair system the gates of the devices are not electrically interconnected and the shown electrical interconnection would be broken so that a voltage difference could be applied therebetween.

It is of particular importance that if semiconductor regions (11) and (12) in FIG. 4 are considered to be of the same doping type, (ie. N or P or intrinsic), and metal (15) or a silicide in regions (2a) and (3b), provides rectifying junctions on said semiconductor (11) and (12), then applying gate volts (Vg) simultaneously to gates (15a) and (15b) can effect a single substrate type, (ie. single device), equivalent to (CMOS). For instance, if semiconductor regions (11) and (12) are both N-type and a positive value of (Vdd) is applied to the rectifying junction at (3b) while a less positive voltage (Vss) is applied to rectifying junction (2a), then said applied voltages (Vdd) and (Vss) will cause the rectifying junction at (3b) to be forward biased and the rectifying junction at (2a) to be reverse biased. Application of a negative gate voltage to gates (15a) and (15b) just sufficient to cause onset of inverted channel regions thereunder in the semiconductor, in effect causes the rectifying junction at (3b) to become reverse biased and the rectifying junction at (2a) to become forward biased at said channel regions. That is, the reverse and forward biased rectifying junction positions are switched. It will be appreciated that if said forward biased rectifying junctions are not required or allowed to carry much current flow, which is effected by limiting the magnitude of the applied gate voltage and external loading connected at (2b) and (3a), the end effect will be to cause the voltage (Vm), as identified in FIG. 4, to shift between (Vdd) and (Vss). It is pointed out that it is preferable to effect an essentially non-rectifying contact for sensing (Vm) at (2b) and (3a). That is, the use of a different metal and/or silicide might be preferable in semiconductor regions (2b) and (3a) as compared to that utilized in semiconductor regions (2a) and (3b), said different metal and/or silicide serving to form non-rectifying rather than rectifying junctions with the semiconductor substrate at (2b) and (3a). The Semiconductor substrate (11) and (12) can also, or in the alternative, be caused to be of a doping level at (2b) and (3a) by diffusion or ion implantation for instance, so as to cause an effectively non-rectifying junction at (2b) and (3a) using the same metal and/or silicide that forms Schottky barrier rectifying junctions at (2a) and (3b). (Note that metal-semiconductor and metal-silicide-semiconductor junctions wherein the semiconductor is relatively highly doped, (eg. typically ten-to-the-eighteenth-per-centimeter-cubed and higher), often demonstrate essentially non-rectifying current-voltage characteristics). As well, while introducing a high resistance region, use of a compensated essentially intrinsic semiconductor at the (2b) and (3a) regions can provide non-rectifying contacts to a metal deposited thereon, and will not form undesired rectifying junctions with adjacent regions of semiconductor which are doped metalurgically or by application of a gate voltage. In fact, the entire substrate can be intrinsic with N and P-type doping effected completely by applied gate voltages. This avoids the problem which can develop wherein a channel region accessing opening in a gate is sufficiently large that inverting channel voltage applied thereto can not serve to invert the channel region within the opening, thereby causing a rectifying junction between a doped semiconductor inverted channel and said channel accessing region. Where channel accessing regions are sufficiently small, this will not occur even in a doped semiconductor, and in fact reverse leakage current through such a rectifying junction, where it does exist, can make said semiconductor compensation unnecessary.

The single device equivalent to (CMOS) just discussed demonstrates non-inverting characteristics. That is, an increased gate voltage causes an increased mid-point channel accessing region voltage (Vm). Conventional diffused junction (CMOS) does not provide such a noninverting device without more than one (CMOS) device system present in series. As will be discussed supra, it is also possible to provide alternative device geometry which demonstrates inverting characteristics by placing the Schottky barrier rectifying junctions at the mid-point channel accessing region, and ohmic junctions at the source and drain.

It will be appreciated that an equivalent single device (CMOS) system can also be effected on P-type semiconductor, wherein opposite polarity applied voltages (Vdd), (Vss) and (Vg) are utilized. In both cases, the required substrate is of one type doping only. That is, formation of a checkerboard of alternating N and P-type doping regions is not required. emphasis added. The appropriate Claims are, in particular, to be interpreted to cover such single device equivalents to (CMOS). It is also specifically noted that the electrically interconnected non-rectifying junctions in the (CMOS) type devices of the Honma et al. Patent cited in the Background Section herein are from opposite type semiconductor. The present invention device electrically interconnected non-rectifying junctions are on the same type material, emphasis added. It is also noted that non-rectifying junctions are easily achieved between aluminum and P-type silicon.

The present invention then can include devices in which Schottky barriers which are made essentially non-rectifying are present. It should also be understood that said Schottky barrier junctions which are made essentially non-rectifying do not have to be electrically interconnected, but could be represented by junctions (2a) and (3b), with junctions (2b) and (3a) being rectifying. This configuration on a single type substrate would, for instance, provide a balanced differential (MOSFET) pair in which, during operation, junctions (2b) and (3a) could be reverse biased and in which leakage current therethrough is controlled by application of appropriate semiconductor conductivity modulating gate voltages.

A voltage controlled switch can be configured from a (MOSFET) which has a rectifying Schottky barrier source junction, a non-rectifying drain junction, and a channel region therebetween, which channel region has an insulator and gate sequentially positioned adjacent thereto such that application of a voltage to said gate effects semiconductor doping in said channel region. That is, applying a positive voltage to the gate will attract electrons to the channel region and application of a negative gate voltage will attract holes to the channel region. Application of a voltage drain to source, such that the source junction is reverse biased, leads to little current flow. That is, only reverse bias Schottky barrier source current flows. By then applying a voltage between gate to source such that an inverted channel region is formed, a forward biased current through said source Schottky barrier junction can be effected. Such a voltage controlled switch is functionally a bit like a non-latching Silicon Controlled Rectifier (SCR). That is, forward current flow through a Schottky barrier can be started, and stopped, simply by the application of and removal of, a gate to source voltage. No known reference discloses such a configuration and use of a (MOSFET) device as described. This can also control the "direction" of rectification. That is if the device is not conducting in one direction with one polarity of drain to source voltage applied, it would conduct if the drain to source voltage polarity were reversed. Application of gate voltage would then terminate said conduction. Gate voltage can be applied gate to substrate, with drain to source serving as a gate voltage controlled rectification direction device. For instance, without gate voltage applied the device would conduct drain to source, and with gate voltage applied conduct source to drain. Again, the Schottky barrier forms a rectifying junction with either N or P-type semiconductor and the gate voltage controls the effective doping type in the semiconductor channel region.

FIGS. 9(a) through 9(k) demonstrate a preferred (MOSFET) fabrication process, including steps for providing isolation of devices via provision of relatively thick silicon dioxide therebetween. FIG. 9(a) shows a side view of silicon substrate (90). FIG. 9(b) shows said silicon substrate (90) in side view with relatively thick layer of silicon dioxide (91) grown atop thereof. FIG. 9(c) shows, in side view, said relatively thick layer of silicon dioxide (91) etched to the silicon (90) surface in the center region thereof. (Many such regions would be formed an a substrate in production setting). FIG. 9(d) shows a side view of a relatively thin layer of silicon dioxide (92) grown in said center region. This relatively thin layer of silicon dioxide (92) is of a depth appropriate for use as a gate oxide in a (MOSFET), (eg. typically hundreds to thousands of Angstroms). FIG. 9(e) shows, in side view, the structure of FIG. 9(d) with a relatively thick layer of gate forming metal deposited thereover. FIG. 9(f) shows a top view of the structure shown in FIG. 9(e), with a photoresist (96) pattern atop the relatively thick layer of gate forming metal (93) atop said relatively thin layer of silicon dioxide (92). Shown are device drain (94) and source (95) regions separated by a gate oxide formed from said relatively thin layer of silicon dioxide (92). FIG. 9(g) shows the structure of FIGS. 9(e) and 9(f) in which said relatively thick layer of gate forming metal (93) and the relatively thin layer of silicon dioxide (92) have been etched to expose the underlying silicon substrate, prior to removal of the photoresist (96). Note that while not shown, a silicon substrate etch can also be performed at this point and be within the scope of the present invention preferred fabrication method. Such a silicon etch would provide a structure appearing much as shown in FIGS. 3 and 4. FIG. 9(h) shows the structure of FIG. 9(g) with the photoresist (96) removed and with a relatively thin layer of silicide forming metal (97) deposited thereover. FIG. 9(i) shows the structure of FIG. 9(h) after a silicide (98) forming anneal, and an etch which removes any remaining silicide forming metal (97). Note that the etchant is selected so as not to adversely effect the relatively thick layer of gate forming metal, but so that it serves to remove any remaining thin layer of device drain (94) to source (95) shorting silicide forming metal on the etched, gate insulator forming, sides of the relatively thin layer of silicon dioxide (92). This is the case even where the relatively thick layer of gate forming metal and the relatively thin layer of silicide forming metal are the same element. It has been found, however, that Aluminum is a good element for use as a relatively thick gate forming metal (93) and that Chromium is a good relatively thin layer of silicide forming metal (97) element for use on either N or P-type silicon. This is in part because a chromium etchant comprised of cerric ammonium nitrate, (eight (8) grams), and perchloric acid, (three (3) milliliters), in deionized water, (forty (40) milliliters), is effective in etching chromium but essentially ineffective in etching Aluminum, and in part because Aluminum adheres well to silicon dioxide after deposition in a sputtering chamber. Unless done with a substrate held at an elevated temperature, deposited Chromium on silicon dioxide does not always adher so well, with water necessary in subsequent processing steps serving to "crinkle" said Chromium off of said silicon dioxide. FIG. 9(j) shows the structure of FIG. 9(i) but with the relatively thick layer of gate forming metal (93), over the relatively thick layer of silicon dioxide (91), removed. An additional but simple photoresist procedure accomplishes this when desired. In fact, the same mask used to effect etching of the relatively thick layer of gate forming metal and silicon dioxide as represented in FIG. 9(c), can be used at this point, coupled with use of an opposite type photoresist, (eg. positive photoresist instead of negative photoresist). The above sequence of Figures demonstrates a preferred method of fabricating the (MOSFET) devices of the present invention. FIG. 9(k) represents a structure as in FIG. 9(i), but in which the silicon substrate (90) is comprised of two different dopings, (90a) and (90b) within one (MOSFET) device region. Said two dopings (90a) and (90b) could be of the same type, or of opposite (eg. N and P-type), types. FIG. 9(l) shows two (MOSFETS) on one substrate, each fabricated entirely over a doping single level or type of silicon, (ie. (90c) and (90d). If the doping types (90c) and (90d) are of opposite type this represents a (CMOS) structure. FIG. 9(m) shows a structure in which junction regions from two adjoining (MOSFET) structures are merged. It is again mentioned that the type of, and level of, doping of a semiconductor substrate annealed to a metal to form a junction determine the electrical characteristics of said formed junction. Annealing chromium at approximately four (400) to five (500) hundred and above degrees centigrade to either N or P-type silicon, doped to levels below about ten-to-the-eighteenth per centimeter cubed, provide rectifying junctions on both silicon types. Annealing chromium to silicon of either type doped approximately ten-to-the-eighteenth and above per centimeter cubed, provides junctions with essentially non-rectifying characteristics. Hence, controlling the type and the level of doping of silicon to which chromium is annealed can provide junctions with a wide variety of electrical characteristics. Metals other than chromium can also be utilized. As described earlier in this Disclosure, this enables production of a variety of devices.

Figure 10A:
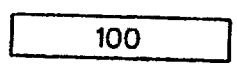
FIGS. 10(a) through 10(i) show steps in fabrication of a non-inverting single device equivalent to (CMOS)
Figure 10F:
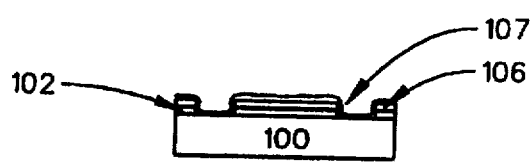
Figure 10B:
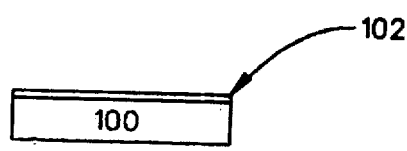
Figure 10C:
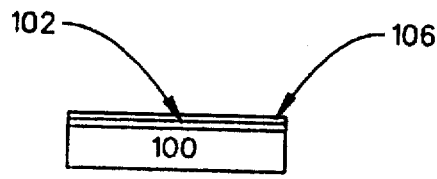
Figure 10G:
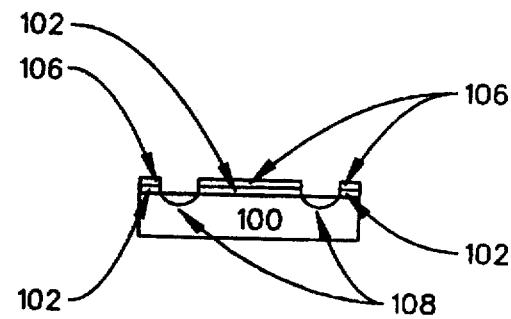
Figure 10D:
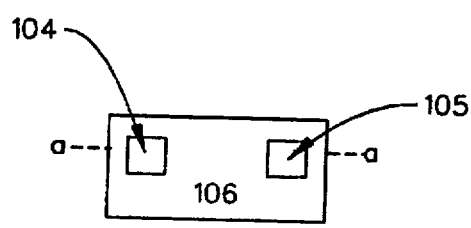
Figure 10H:
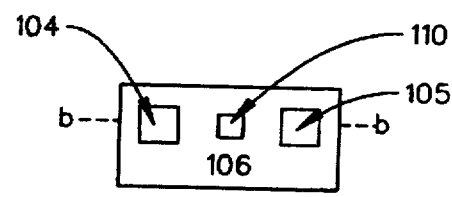
Figure 10E:
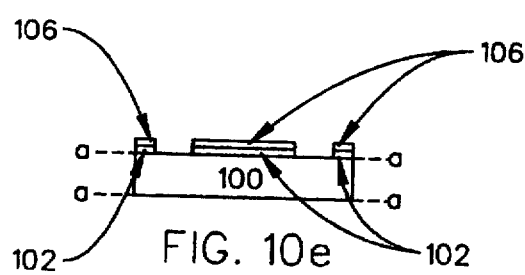
Figure 10I:
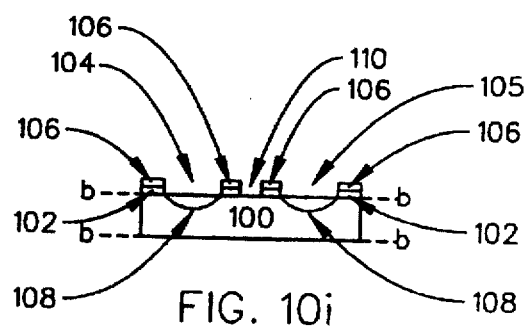

Next, FIGS. 10(a) through 10(i) demonstrate a preferred fabrication procedure for a non-inverting single device equivalent to (CMOS), which is fabricated on a single substrate type. Note that only device forming steps are shown and it is to be assumed that device separation can be provided similar to as shown in FIGS. 9(a)–9(d). FIG. 10(a) shows a side view of a silicon substrate (100). FIG. 10(b) shows silicon dioxide (102) grown atop said silicon substrate (100) and FIG. 10(c) shows a layer of gate forming metal (106) deposited atop said silicon dioxide (102). FIG. 10(d) shows a top view of source (104) and drain (105) openings are made to the silicon (100) through gate forming metal (106) and silicon dioxide (102). FIG. 10(e) shows a side view of the same openings shown in FIG. 10(e). FIG. 10(f) shows a layer of silicide forming metal (107) deposited over the silicon substrate (100). FIG. 10(g) shows the presence of silicide (108) formed after an anneal procedure which, when chromium is utilized can be four-hundred-fifty (450) degrees centigrade for thirty (30) minutes. FIG. 10(h) shows a top view of the substrate of FIG. 10(g) but with a channel accessing opening (110) also present, etched through the gate forming metal (106) and silicon dioxide (102). FIG. 10(i) shows a side view thereof taken at b—b in FIG. 10(h). Note that in said side view of FIG. 10(i) the structure is validly described as two (MOSFETS) with one Schottky barrier, (with non-rectifying characteristics), of each being electrically interconnected, very much as shown in FIG. 4. (Note, in FIGS. 9(a) through 9(m) and FIGS. 10(a)

through 10(i) no etch is shown into semiconductor substrates (90) and (100) as are shown in FIGS. 3, 4 and 5. Said semiconductor etch is optional. It is noted that the silicon substrate (100) can be intrinsic, N-type or P-type and that silicon channel region in opening (110) can be intrinsic or oppositely doped, even where the silicon substrate (100) is N or P-type. It is noted that opening (110) might be two openings, the silicon under one being heavily doped N-type and heavily doped P-type in the other to enhance non-rectifying contact to the silicon channel region in both the metalurgical and inverted state, however, such is typically unnecessary because leakage current through even a reverse biased junction will allow a voltage to be monitored in the channel through a reverse biased junction. It is noted that testing of fabricated devices tends to verify this conclusion. Where the hole (110) is sufficiently small fringing of an electric field due to a voltage applied to the gate will serve to invert the silicon channel region even under the hole (110), and a junction between inverted and noninverted silicon in the silicon channel region under the hole (110) will not exist. It should be clear in view of the foregoing that single device equivalent to (CMOS) can be considered as two (MOSFETS) formed on the same type semiconductor, with non-rectifying drain junctions interconnected. At this point it is specifically pointed out that while the Honma et al. Patent, the closest known art and cited in the Background Section herein, shows a (CMOS) device system in which non-rectifying drain junctions are interconnected, said non-rectifying drain junctions are to N-type silicon in one device and to P-type silicon in the other of two electrically interconnected devices. That is, the (CMOS) structure presented requires the presence of both N and P-type silicon. This is an extremely important contrasting distinction regarding the present invention, in which only a single substrate type (ie. N-type, P-type or intrinsic), is required, emphasis added. That is, the costly steps associated with forming an alternating checkerboard of N and P-type regions in a substrate common to all known (CMOS) devices are not necessary.

Testing of non-inverting single device equivalents to (CMOS) on intrinsic silicon has surprisedly shown that application of a voltage from drain to source, Without any gate voltage being applied, produces zero (0.0) volts at the mid-point channel accessing region, with respect to source. Applying a voltage gate to source of a polarity similar to that applied drain to source effects a voltage present at said mid-point channel accessing region. This occurs whether drain and gate are both provided positive or negative polarity voltages with respect to source. This is consistent with the formation of a forward biased rectifying junction at the drain. However, application of a gate to source voltage of an opposite polarity to that applied drain to source effects no drain to source applied voltage present at the mid-point channel accessing region, with respect to the source. This is consistent with the formation of a reverse biased rectifying junction at the drain junction.

Figure 10J:
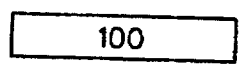
FIGS. 10(j) through 10(r) show steps in fabrication of an inverting single device equivalent to (CMOS).
Figure 10K:
Figure 10L:
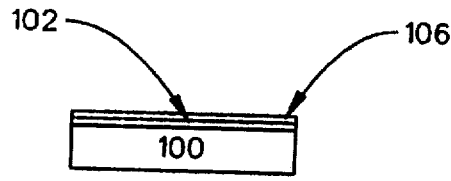
Figure 10M:
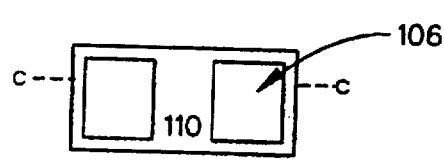
Figure 10N:
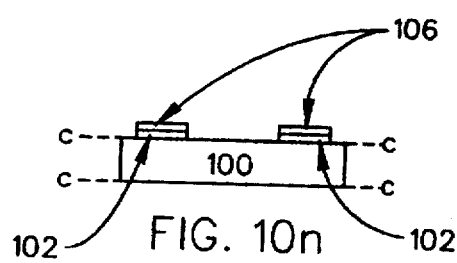
Figure 10O:
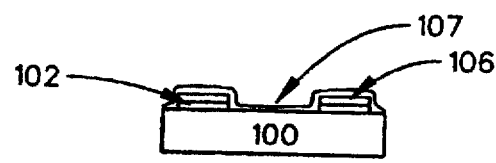
Figure 10P:
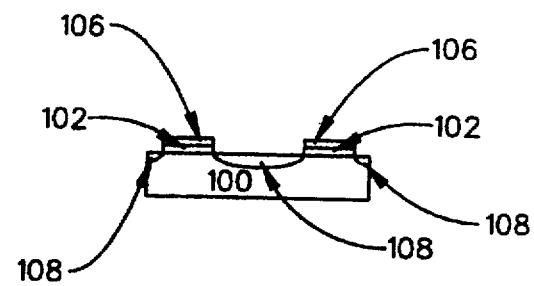
Figure 10Q:
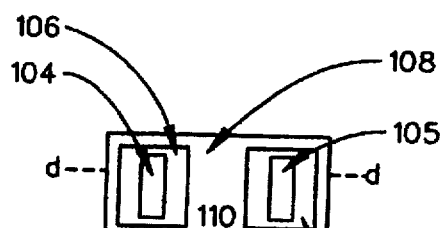
Figure 10R:
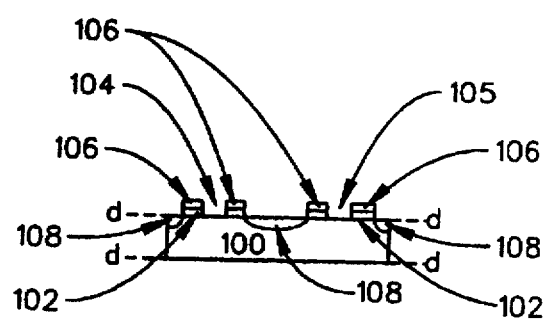

Continuing, FIGS. 10(j) through 10(r) demonstrate a fabrication procedure for an inverting single device equivalent to (CMOS). The fabrication process is similar to that described above for a non-inverting single device equivalent to (CMOS) but the end result is configured so that silicide (108) is present in the silicon at the center opening (110) rather than in the equivalent source and drain regions (104) and (105). Also shown is a delineating guard-ring of silicide (108) around the device which serves to help reduce leakage currents. FIG. 10(j) shows a silicon substrate (100). FIG. 10(k) shows silicon dioxide (102) grown atop the silicon substrate (100). FIG. 10(l) shows gate forming metal (106) deposited atop said silicon dioxide (102). FIG. 10(m) shows center opening (110) etched through the gate forming metal (106) and silicon dioxide (102) to provide access to the silicon substrate (100) surface. FIG. 10(n) is a cross sectional view taken at c—c in FIG. 10(m). FIG. 10(o) shows a layer of silicide forming metal (107) deposited over the substrate of FIG. 10(n). An anneal then causes silicide (108) to form where the silicide forming metal (107) is in contact with the silicon substrate (100) at the mid-point (110) opening. FIG. 10(p) shows all remaining silicide forming metal (107) removed. FIG. 10(q) shows source and drain regions (104) and (105) opened to the silicon substrate (100) surface. FIG. 10(r) is a cross sectional view taken at d—d in FIG. 10(q). It will be appreciated that there are actually two, first and second, channel regions present in this device because the Schottky barrier rectifying junction is situated between two non-rectifying, (ie conductive) junctions. The first and second channel regions are between drain (105) and mid-point (110), and between source (104) and mid-point (110) respectively. Note that the drain (105) to mid-point (110) silicide (108) can be effectively replaced by a resistor, but that such is not optimum as when the mid-point (110) silicide (108) to source (104) Schottky barrier junction is caused, by gate applied volts, to become forward biased, no reverse biased junction then exists to limit current flow drain (105) to source (104) to a reverse bias Schottky barrier junction level. For the purpose of Claim construction such a configuration is to be considered but a case of a Schottky barrier which demonstrates non-rectifying essentially ohmic characteristics as a result of semiconductor doping and the like.

A bit of reflection should make it clear that application of a gate voltage to the device of FIG. 10(i) is necessary to effect a rectifying Schottky barrier drain (105) to source (104) applied voltage, at an non-rectifying mid-point (110) location. Say for instance the silicon substrate (100) is P-type and positive voltage is applied to rectifying Schottky barrier drain (105) with respect to source (104). Said rectifying Schottky barrier drain (105) junction will be reverse biased, said rectifying Schottky barrier source junction (104) will be forward biased. As a result no voltage appears at mid-point (110). Application of a positive gate to source voltage will invert the silicon in the channel region to N-type, thereby causing the rectifying Schottky barrier mid-point drain and source junctions to become forward and reverse biased respectively, thereby effecting a voltage at non-rectifying mid-point (110).

A constant polarity drain (105) to source (104) applied voltage present at rectifying Schottky barrier mid-point (110) in the device of FIG. 10(r) however, will be caused to be reduced by application of a gate to source (104) voltage. For instance if the silicon substrate (100) is P-type, application of a positive voltage at non-rectifying drain (105) will cause said applied positive voltage to appear through forward biased rectifying Schottky barrier mid-point (110) junction through non-rectifying drain (105) with no gate volts applied with respect to non-rectifying source (104), said positive volts appearing across reverse biased rectifying Schottky barrier mid-point (110) junctions to the source (104). Application of positive gate volts with respect to non-rectifying source (104) will invert the silicon in the channel regions and cause the rectifying Schottky barrier mid-point (110) junction to the non-rectifying drain (105) to become reverse biased, and the rectifying Schottky mid-point (110) barrier to the non-rectifying source (104) to become forward biased, thereby lowering said mid-point (110) voltage.

It is to be understood that while the non-inverting and inverting embodiments are shown with channel physically between two Schottky barrier junctions, and with Schottky barrier junctions physically between two non-rectifying junctions respectively, such is demonstrative and not limiting. For instance, the channel region in the non-inverting embodiment could be physically split into two parts which are electrically interconnected and the Midpoint Schottky barrier junctions in the inverting embodiment could be located non-centrally but electrically interconnected. This could occur, for instance, if two separate devices are involved or if physical layout on a single substrate is changed. Functionally equivalent embodiments to any device or device system demonstrated in this Disclosure are within the scope of the present invention and appropriate Claims.

It is also mentioned that a voltage present at a mid-point channel accessing region or mid-point Schottky barrier in non-inverting and inverting single device equivalents to (CMOS) respectively depend upon two applied voltages, namely, upon an applied drain to source and an applied gate to source voltage. As a result, the inverting and non-inverting single device equivalents to (CMOS) can be used as modulators to provide an output at the mid-point which is, at least in some operating voltage ranges, proportional to the product of the two applied voltages.

FIGS. 11(ao)–11(go), 11(a1)–11(g1), 11(a2)–11(g2p) and 11(a3)–11(g3), there are shown generally similar approaches to forming Schottky barrier junctions which can be incorporated into the Schottky barrier junction based systems demonstrated by FIGS. 9(a)–9(m) and FIGS. 10(a)–10(r). The reason for incorporating such is to limit the area of Schottky barrier junction to the minimum necessary to provide a channel region current, but minimize leakage current to a semiconductor substrate from a drain.

FIGS. 11(ao), 11(a1), 11(a2), and 11(a3) show a silicon substrate (100), and FIGS. 11(bo), 11(b1), 11(b2) and 11(b3) show a silicon dioxide grown (102) atop thereof. FIG. 11(c0) shows the substrate of FIG. 11(bo) with the silicon dioxide (102) and silicon (100) etched anisotropically and isotropically respectively. Said silicon is etched to an underlying insulating substrate (SUB). FIG. 11(c1) is the substrate of FIG. 11(b1) with the silicon dioxide (102) and silicon (100) etched anisotropically and isotropically respectively. FIGS. 11(c2) and 11(c3) show the substrates of FIGS. 11(b2) and 11(b3) with both the silicon dioxide (102) and silicon (100) etched anisotropically. It should be understood that isotropic etching is commonly achieved by a wet acid technique, and that anisotropic etching is typically achieved by dry plasma techniques. FIG. 11(do) is FIG. 11(co) repeated to hold the place in the sequence alongside the other drawings. FIGS. 11(d1), 11(d2) and 11(d3) show insulating silicon dioxide (102) grown and etched in the etched silicon (100) regions. Note that FIG. 11(c3p) shows a diffused region (100d) which can serve to effect an essentially non-rectifying junction rather than a Schottky barrier junction with a deposited silicide forming metal (107) as shown in FIGS. 11(e0), 11(e1), 11(e2) and 11(e3). It is best to deposit said silicide forming metal by a non-line-of-sight technique such as sputtering, when an undercut surface silicon dioxide device geometry is present so that said silicide forming metal can be deflected to the source and drain ends of said silicon channel. This is in contrast to the line-of-sight deposition approach required in devices with geometries such as demonstrated in FIGS. 3 and 4. After a silicide forming anneal (eg. 450 degrees centigrade for 30 minutes if chromium and silicon are utilized), all remaining silicide forming metal (107) is removed by an etching procedure, leaving silicide regions (108) in place, as shown in FIGS. 11(fo), 11(f1), 11(f2) and 11(f3). It is to be appreciated that the silicide (108) regions are present only adjacent to the ends of channel regions, thus the leakage currents, being proportionate to junction area, are reduced to essentially a minimum, emphasis added. FIGS. 11(go), 11(g1), 11(g2) and 11(g3) show conductor metal (103), (eg. typically aluminum), applied and etched to provide contact to the Schottky barrier junction regions (108), and to provide gate metalization. Note that FIG. 11(g3p) shows a variation wherein the silicon dioxide (102) covers even more of the etched silicon (100) region.

FIGS. 11(ha), 11(hb), 11(i), 11(j) and 11(k) show Schottky barrier (MOSFETS) with Source, Drain and Gates identified, fabricated to include the insulating material achieved low leakage Schottky barrier device geometries as just described. Devices fabricated as just described eliminate a large portion of the Schottky barrier junction area such shown as present in FIGS. 3 and 4 between the metal (15) and semiconductor (11) and (12). It is also to be noted that the Schottky barrier junction in, for instance, FIG. 11(g0) and 11g1 are, as a consequence of the isotropic etching of the silicon (100), placed under a gate metalization. This eliminates another source of nonoptimum current limitation In that during operation no high resistance gap exists between a gate voltage applied induced channel in the silicon and the Schottky barrier at the source and drain ends of said channel region. The present Schottky barrier devices then overcome both high leakage current and high effective channel region to source and drain gap induced resistance problems. Said problems were the focus in the Patent to Koeneke et al, U.S. Pat. No. 4,485,550, which Patent described the use of source and drain ion implantations as an approach to the overcoming thereof.

FIGS. 11(l), 11(n) and 11(o) show non-inverting single device equivalents to (CMOS) and FIG. 11(m) shows an inverting version. The same identifying numeral system is used in FIGS. 11(ha) to 11(o) as was used in FIGS. 11(a0) to 11(g3). Namely, silicon (100), silicon dioxide (102), silicide (108), doped silicon region (100d), conductor metal (103) and SUB is an insulating substrate such as saphire.

It is also within the scope of the present invention to effect selected insulated regions in an etched silicon source or drain region by deposition of a material, (eg. silicon nitride), which protects a silicon region during an oxidation procedure, then remove said protective material after said oxidation procedure. As well, a deposited nonoxide insulator in an etched semiconductor region might be allowed to remain with portions thereof etched away at ends of a channel region to allow silicide formation thereat. Such approaches might provide better results than simply growing oxide and etching it away where desired, particularly where gate silicon dioxide is undercut by an isotropic silicon etch, because selective etchants could be utilized to avoid adversely affecting an undercut oxide geometry.

Turning now to FIGS. 12(a) and 12(b) there are shown circuit symbols for conventional diffused junction P-Channel and N-Channel (MOSFET) devices. The directions of the arrowheads on the line representing the substrate identify the (MOSFET) device type. (It is noted that the substrate is shown electrically interconnected to the source in FIGS. 12(a) through 15(b). This is not to be considered absolutely required for a conventional or Schottky barrier (MOSFET) to operate, but simply observes conventional symbolism). In use the Drain (D) junction is considered reverse biased and a negative/(positive) voltage is applied to the gate (G) of a P-Channel/(N-Channel) device respectively. Application of a positive or negative voltage to a gate causes carriers, (ie. electrons or holes respectively), to accumulate at the semiconductor-insulator, (in the case of silicon an oxide is a typical insulating material), interface channel region in the semiconductor thereby forming a channel between source and drain. When the semiconductor is P-type and a positive gate voltage is applied, a conducting inverted N-type channel will form. When the semiconductor is N-type and a negative gate voltage is applied, a conducting inverted P-type channel will form.

FIG. 13(a) shows a conventional diffused junction (MOSFET) (CMOS) device system. Application of a gate voltage to interconnected gates (G) near positive (+Vdd) causes the N-Channel device to turn "on", (ie. form a conducting channel between its source (S) and drain (D)), while the P-Channel is turned "off" (ie. has no conducting channel between source and drain), thereby effecting a voltage near ground potential at the interconnected drains (D) point (M). Application of an essential ground potential to interconnected gates (G) causes the P-Channel device to turn "on", (while the N-Channel device is "off"), thereby effecting a voltage near positive (+Vdd) at said interconnected drains (D) mid-point (H).

Continuing, it must be understood that the present Schottky barrier (MOSFETS) operate differently than do conventional diffused junction (MOSFETS) in that applied Gate voltage effect on channel region substrate doping serves to modulate the leakage current through a reverse biased Schottky barrier junction. An effectively higher channel region doping serving to cause an increased reverse leakage current rather than simply effect a conducting similar type of doped semiconductor between source and drain. This difference in operational basis causes the voltage which must be applied between a drain and source of a Schottky barrier (MOSFET) to be opposite to that applied in a conventional diffused junction (MOSFET). That is, current flows in the opposite direction in a Schottky barrier (MOSFET) as compared to a conventional diffused junction (MOSFET) of the same channel type, (ie. N-Channel or P-Channel). The following table demonstrates the voltage polarity comparisons in a clear concise manner:

|  | (MOSFETS) | | | |
| --- | --- | --- | --- | --- |
|  | DIFFUSED/ JUNCTION | | SCHOTTKY BARRIER | |
|  | GATE | DRAIN | GATE | DRAIN |
| P-TYPE SUBSTRATE (N-CHANNEL) | + | + | + | − |
| N-TYPE SUBSTRATE (P-CHANNEL) | − | − | − | + |

Note that operational gate voltage (Vg) polarity is the same for both diffused junction and Schottky barrier (MOSFET) technologies as negative/(positive) gate volts attract holes/(electrons) to a channel region in a semiconductor channel region. However, the operational applied drain voltage (−Vdd), as identifed above, is reversed comparing conventional diffused junction and Schottky barrier (MOSFETS). This means that the position of N-Channel and P-Channel devices must be reversed in a Schottky barrier (CMOS) system. FIG. 13(b) shows this configuration using the same circuit symbols as used for conventional diffused junction (MOSFETS), but with a (SB) included to indicate that Schottky barrier junction technology is utilized in both source and drain. With a gate voltage (Vg) near (+Vss) applied to the interconnected gates (G), the N-Channel device will have an effectively positive voltage applied thereto between its gate (G) and source (S). This will attract electrons to, and cause inversion of, the channel region therein, causing the Schottky barrier junction electrically connected to the(−Vdd) source to be reverse biased but conduct a gate controlled leakage, (ie. tunneling), current therethrough. The drain (D) of said N-Channel device will be forward biased in the inverted channel region thereby providing a voltage (Vm) at the mid-point interconnected drains (D) of the N-Channel and P-Channel devices to be at essentially negative (−Vdd). Note that while the inverted channel in the N-Channel device is conducting, the channel in the P-Channel device does not conduct and is "off". This is confirmed by the curves shown in FIGS. 6 and 7, which curves were derived by test of actual fabricated P-Channel and N-Channel Schottky barrier (MOSFETS). It is believed that energy band pinning in the channel region accounts for this result. That is, a noninverted channel region seems to be prevented from accumulating and therefore does not form a reverse bias conducting Schottky barrier junction with an applied source (or drain) region metalization, as does an inverted channel region. This point is subject of continued investigation. Continuing, when the gate voltage (Vg) is caused to be near negative (−Vdd), it should be appreciated by symetry that the N-Channel device will be "off" and that a conducting inverted P-Channel will be effected in said P-Channel device. That is, an effective negative voltage applied to the interconnected gates (G) attracts holes to the channel region of the P-Channel Schottky barrier device causing channel region substrate type inversion. This of course, effects a voltage (Vm) very near −Vss at the mid-point interconnection of drains (D) as the drain Schottky barrier junction in the inverted channel region of the P-Channel device is effectively forward biased with respect to the source voltage applied thereto. It is to be understood the that +Vss in FIG. 13(b) can be replaced by a ground and the device system will still work.

(Note, that the Lepselter and Sze article cited, and incorporated by reference infra herein, states that it is was the source in their Schottky barrier MOSFETS which was reverse biased during operation. The Schottky barrier MOSFETS fabricated by the Applicant, however, operated with the drain reverse baised. In the MOSFET devices reported by Lepselter and Sze, the same voltage polarities would be applied to gate and drain as applied in conventional diffused junction MOSFETS.)

FIG. 8 represents the gate voltage influence on voltage at mid-point (M) connection of the drains (D) of the N-Channel and P-Channel devices shown in FIG. 13(b).

FIG. 14 shows circuit symbols for Schottky barrier (MOSFETS) of the same channel type, (shown P-Channel but simply changing device type indicating arrowhead direction represents N-Channel as well), configured in a balanced differential system such as commonly found in operational amplifiers. Note that nonsemiconductor components of Schottky barrier source junctions are electrically interconnected to effect the configuration. Also note that the gates are not electrically connected, but will connect across a source of voltage.

FIGS. 15(a) and 15(b) show circuit symbols for N-Channel Schottky barrier (MOSFETS) configured in an active device with (MOSFET) load system. In FIG. 15(a) the load is an N-channel (MOSFET) and in FIG. 15(b) the load is a P-channel (MOSFET). Similar systems can be configured using P-Channel Schottky barrier active device (MOSFETS) with (MOSFET) loads and FIGS. 15(a) and 15(b) can be considered to show said arrangements by assuming the device type indicating arrowheads reversed.

FIGS. 16a and 16b show, respectively, circuit symbols for non-inverting and inverting single device equivalents to CMOS. The same identifiers are used in FIGS. 16a and 16b as are used in FIGS. 10r and 10i respectively.

It is to be noted that Schottky barrier junctions are comprised of nonsemiconductor and semiconductor components, such as a (metal and/or metal silicide), and silicon respectively. Functional electrical interconnection of two Schottky barrier junctions is typically effected by connecting the nonsemiconductor components of two Schottky barrier junctions. Electrical interconnections can be achieved by conducting traces on a substrate, or by external wiring which accesses the nonsemiconductor component. It can occur that a common semiconductor area between two devices can effect a semiconductor electrical interconnection as well. In such a case a contact metal can be considered a nonsemiconductor "electrical interconnection" component. Also, the channel regions of Schottky barrier (MOSFETS) are formed in semiconductor and are typically continuous between respective rectifying source and drain junctions. That is, nonsemiconductor components of a Schottky barrier junction typically "sandwich" a "continuous" semiconductor channel region, which has an insulator and gate sequentially situated adjacent thereto, therebetween. Also "respective" rectifying source and drain junctions are those rectifying junctions associated with a semiconductor channel region. As well, Schottky barrier junctions are typically assumed to be rectifying. It can occur, however, that a Schottky barrier can be made to demonstrate non-rectifying characteristics. Formation on heavily doped semiconductor, for instance, can provide this result. In the Claims, the term "non-rectifying" will be used to identify Schottky barrier junctions which demonstrate other than rectifying characteristics, said other characteristics typically being ohmic.

It is also to be understood that while Schottky barrier junctions are typically formed between a metal and a semiconductor or a metal-compound, (eg. silicide where silicon is utilized), and a semiconductor, the terms "metal forming silicide", in the case where the semiconductor is silicon, should be interpreted broad enough to include any material which forms a rectifying junction with a semiconductor, whether technically a metal or not, for the purposes of Claim interpretation.

It is also noted that (MOSFET) devices formed on N-type semiconductor and which operate when a channel region is inverted are termed P-Channel devices. Likewise, (MOSFET) devices formed on P-type semiconductor and which operate when a channel region is inverted are termed N-Channel devices. That is, N-Channel (MOSFET) devices are formed on P-type semiconductor and P-Channel (MOSFET) devices are formed on N-type semiconductor. The reader should not be confused by this and in reading the Claims should keep this distinction clearly in mind.

The terminology "Single device equivalent to (CMOS)" has been used in the Disclosure because it draws attention to important similarities between the present invention devices and (CMOS), where the present invention involves one (MOSFET)-like device formed on a single type semiconductor, in place of two electrically interconnected (MOSFET) devices in series as required in conventional diffused junction (CMOS). For the purpose of Claim construction however, the terminology "single device with operating characteristics similar to (CMOS)" will be utilized.

Also, it is to be clear that when it is stated that a present invention device is formed on a "single-type" semiconductor, the intended meaning is that there is no requirement for a checkerboard of alternating N and P-type regions in a semiconductor to effect a single device with operating characteristics similar to conventional diffused junction (CMOS) device systems. It does not mean that regions of a single device of the present invention formed on N or P-type semiconductor can not have opposite type doping or intrinsic semiconductor present therein, or that single devices of the present invention formed on intrinsic semiconductor can not have regions of doped semiconductor present, or that a checkerboard of N and P-type regions, with single devices of the present invention in said regions can not be present, emphasis added. It means only that each present single device which provides operating characteristics similar to conventional diffused junction (CMOS) multiple device systems is formed in a single type semiconductor and that there is no requirement that a device formed in N-type semiconductor be electrically interconnected to a device formed in P-type semiconductor to provide the (CMOS) operating characteristics. The use of the terms "single device" should be taken to sufficiently distinguish over conventional diffused junction (CMOS) device systems which require both an N and a P-Channel device be present with their drains electrically interconnected in series to provide a (CMOS) device system which demonstrates similar operating characteristics to a single device of the present invention.

In the Claims, it will be appreciated that when a Schottky barrier (CMOS) device system is described as resulting from electrical interconnection of present invention N and P-Channel Schottky barrier (MOSFETS) devices, the geometry of the Schottky barrier-channel region is well identified as providing Schottky barriers only at the end(s) of a channel region, which geometry serves to reduce leakage current problems, and it is this which distinguishes over known prior art in multiple present invention device systems.

It is also noted that rectangular source and drain geometry was used for demonstrative, not limiting, purposes in the foregoing. Circular geometry, wherein a source region is essentially surrounded by a drain region for instance is to be considered equivalent and within the scope of the present invention.

It is noted that a Hewlet-Packard 4145B Parameter Analyzer was utilized to make measurements in experimental work reported in this Disclosure.

Having hereby disclosed the subject matter of the present invention, it should be obvious that many modifications, substitutions, and variations of the present invention are possible in light of the teachings. It is therefore to be understood that the present invention may be practiced other than as specifically described, and should be limited in breadth and scope only by the Claims.

I claim:

1. A non-inverting single Metal Oxide Semiconductor (MOS) device with operating characteristics similar to multiple device Complimentary Metal Oxide Semiconductor (CMOS) systems in which an applied gate voltage controls a voltage present at an essentially electrically isolated terminal thereof; comprising a semiconductor channel region and two rectifying Schottky barrier to channel region junctions in a surface region of a single doping type semiconductor, selected from the group consisting of N-type, P-type, Intrinsic, N-type and Intrinsic, P-type and Intrinsic, N-type on insulator, and P-type on insulator, said rectifying Schottky barrier to channel region junctions being separated by said semiconductor channel region, wherein a gate to which semiconductor channel region doping type modulating voltage can be applied is associated with said semiconductor channel region, said gate being offset from said semiconductor channel region by an insulating material, such that application of a sufficient negative voltage to the gate will attract holes into said semiconductor channel region, and such that application of a sufficient positive voltage to the gate will attract electrons into said semiconductor channel region, the purpose of applying such gate voltage being to modulate the effective doping type of said semiconductor channel region, such that when a constant polarity voltage is applied between said rectifying Schottky barrier to channel region junctions one thereof forward conducts to the channel region while the other thereof simultaneously does not, which Schottky barrier to channel region junction forward conducts at a specific time being determined by semiconductor doping type in said semiconductor channel region, said semiconductor doping type being determined by applied gate voltage polarity, which essentially electrically isolated terminal electrically contacts, via a junction thereto, said channel region and during use monitors a constant polarity voltage applied to one of the rectifying Schottky barrier to channel region junctions, which constant polarity voltage appears at said essentially electrically isolated terminal essentially through the forward conducting Schottky barrier to channel region junction, which constant polarity voltage monitored by said essentially electrically isolated terminal increases when the voltage applied to said gate is increased; the basis of operation being that said Schottky barrier junctions are formed between said semiconductor channel region and a material which provides a rectifying junction to said semiconductor channel region when it is doped either N or P-type.

2. A non-inverting single Metal Oxide Semiconductor (MOS) device with operating characteristics similar to multiple device Complimentary Metal Oxide Semiconductor (CMOS) systems as in claim 1 in which the essentially electrically isolated terminal contact to said semiconductor channel region is essentially non-rectifying.

3. A non-inverting single Metal Oxide Semiconductor (MOS) device with operating characteristics similar to multiple device Complimentary Metal Oxide Semiconductor (CMOS) systems as in claim 1 in which at least one of said Schottky barrier to channel region junctions is formed in a region etched into said semiconductor, said etched semiconductor region being partially comprised of insulating material, the purpose thereof being to reduce leakage current by limiting the area of Schottky barrier to channel region junctions in contact with semiconductor to regions at ends of said semiconductor channel region.

4. A non-inverting single Metal Oxide Semiconductor (MOS) device with operating characteristics similar to multiple device Complimentary Metal Oxide Semiconductor (CMOS) systems as in claim 1 in which the semiconductor is silicon and the Schottky barrier to channel region junctions are formed between said silicon and at least one material selected from the group consisting of chromium, molybdnium, tungstun, vanadium, titanium, platinum and a silicide of any thereof.

5. An inverting single Metal Oxide Semiconductor (MOS) device with operating characteristics similar to multiple device Complimentary Metal Oxide Semiconductor (CMOS) systems in which an applied gate voltage controls a voltage present at an essentially electrically isolated terminal thereof; comprising first and second essentially non-rectifying channel region junctions in a surface region of a single doping type semiconductor selected from the group consisting of N-type, P-type, Intrinsic, N-type and Intrinsic, P-type and Intrinsic, N-type on insulator, and P-type on insulator, said first and second essentially non-rectifying channel region junctions being separated by first and second semiconductor channel regions from electrically interconnected rectifying Schottky barrier to channel region junctions, wherein first and second gates to which semiconductor channel region doping type effecting modulating gate voltage can be applied are associated with said first and second semiconductor channel regions, said first and second gates being offset from said first and second semiconductor channel regions respectively by insulating material, such that application of a sufficient negative voltage to the first and second gates will attract holes into said first and second semiconductor channel regions, and such that application of a sufficient positive voltage to the first and second gates will attract electrons into said first and second semiconductor channel regions, the purpose of applying such gate voltage being to modulate the effective doping type of said first and second semiconductor channel regions, such that when a constant polarity voltage is applied between said first and second essentially non-rectifying channel region junctions one rectifying Schottky barrier to channel region junction forward conducts while the other simultaneously does not, which Schottky barrier to channel region junction forward conducts at a specific time being determined by semiconductor doping type in said first and second semiconductor channel regions, said semiconductor doping type being determined by applied gate voltage polarity, which essentially electrically isolated terminal electrically contacts, via a junction thereto, said electrically interconnected rectifying Schottky barrier to channel region junctions between said first and second semiconductor channel regions and during use monitors a constant polarity voltage applied to one of the first and second essentially non-rectifying channel region junctions, which constant polarity voltage appears at said essentially electrically isolated terminal essentially through the forward conducting Schottky barrier to channel region junction, which constant polarity voltage monitored by said essentially electrically isolated terminal decreases when the gate voltage applied to said first and second gates is increased; the basis of operation being that said Schottky barrier junctions are formed between said first and second semiconductor channel regions and a material which provides a rectifying junction to a semiconductor channel region when it is doped either N or P-type.

6. An inverting single Metal Oxide Semiconductor (MOS) device with operating characteristics similar to multiple device Complimentary Metal Oxide Semiconductor (CMOS) systems as in claim 5 in which at least one of said Schottky barrier to channel region junctions is formed in a region etched into said semiconductor, said etched semiconductor being partially comprised of insulating material, the purpose thereof being to reduce leakage current by limiting the area of Schottky barrier to channel region junctions in contact with said semiconductor to regions at ends of said semiconductor channel regions.

7. An inverting single Metal Oxide Semiconductor (MOS) device with operating characteristics similar to multiple device Complimentary Metal Oxide Semiconductor (CMOS) systems as in claim 5 in which the semiconductor is silicon and the Schottky barrier to channel region junctions are formed between said silicon and at least one material selected from the group consisting of chromium, molybdnium, tungstun, vanadium, titanium, platinum and a silicide of any thereof.

8. A method of configuring a non-inverting Metal Oxide Semiconductor (MOS) device with operating characteristics similar to Complimentary Metal Oxide Semiconductor (CMOS) systems comprising the steps of:
  a. providing two Metal Oxide Semiconductor Field Effect Transistor (MOSFET) devices, each formed in a surface region of the same single doping type semiconductor selected from the group consisting of N-type, P-type, Intrinsic, N-type and Intrinsic, and P-type and Intrinsic, N-type on-Insulator, and P-type on Insulator, one said (MOSFET) device comprising two junctions, termed source and drain, separated by a first semiconductor channel region, and the second (MOSFET) device comprising two junctions, termed source and drain, separated by a second semiconductor channel region, wherein gates to which semiconductor channel region inverting voltages can be applied are associated with each of the first and second semiconductor channel regions are offset from said first and second semiconductor channel regions by insulating material, such that during use application a sufficient positive voltage to said gates will attract electrons to said first and second semiconductor channel regions, and such that application of sufficient negative voltage to said gates will cause attraction of holes to both of said first and second semiconductor channel regions, the purpose of applying such gate voltage being to, modulate the effective doping type of said first and second semiconductor channel regions between respective source and drain channel regions, which drain junctions are each essentially non-rectifying, and which source junctions are rectifying Schottky barrier junctions, said Schottky barrier junctions each comprising a semiconductor and nonsemiconductor component;
  b. electrically interconnecting the essentially non-rectifying drain junction associated with said first semiconductor channel region, and the essentially non-rectifying drain junction associated with said second semiconductor channel region;
  c. electrically interconnecting said gates, such that during operation nonsemiconductor components of electrically noninterconncted rectifying Schottky barrier source junctions are held at different voltages, and application of a gate voltage controls effective semiconductor channel region doping type in both (MOSFET) devices, and thus which electrically non-interconnected rectifying Schottky barrier source junction forward conducts and which does not forward conduct, thereby controlling the voltage present at the electrically interconnected essentially non-rectifying drain junctions essentially through said forward conducting rectifying Schottky barrier junction;

the basis of operation being that said Schottky barrier junctions are formed between said first and second semiconductor channel regions and a material which provides a rectifying junction to a semiconductor channel region when it is doped either N or P-type.

9. A method of configuring an inverting Metal Oxide Semiconductor (MOS) device with operating characteristics similar to Complimentary Metal Oxide Semiconductor (CMOS) systems comprising the steps of:
  a. providing two Metal Oxide Semiconductor Field Effect Transistor (MOSFET) devices, each formed in a surface region of the same single doping type semiconductor selected from the group consisting of N-type, P-type, Intrinsic, N-type and Intrinsic, P-type and Intrinsic, N-type on Insulator, and P-type on Insulator, one said (MOSFET) device comprising two junctions, termed source and drain, separated by a first semiconductor channel region, and the second (MOSFET) device comprising two junctions, termed source and drain, separated by a second semiconductor channel region, wherein gates to which semiconductor channel region inverting voltage can be applied are associated with each of the first and second semiconductor channel regions are offset from said first and second semiconductor channel regions by insulating material, such that during use application a sufficient positive voltage to said gates will attract electrons to said first and second semiconductor channel regions, and such that application of sufficient negative voltage to said gates will cause attraction of holes to both of said first and second semiconductor channel regions, the purpose of applying such gate voltage being to, modulate the effective doping type of said first and second semiconductor channel regions between respective source and drain junctions, which source junctions are each essentially non-rectifying, and which drain junctions are rectifying Schottky barrier junctions, said rectifying Schottky barrier junctions each comprising a semiconductor and nonsemiconductor component;
  b. electrically interconnecting a nonsemiconductor component of the rectifying Schottky barrier drain junction associated with said first semiconductor channel region, and a nonsemiconductor component of the rectifying Schottky barrier drain junction associated with said second semiconductor channel region;
  c. electrically interconnecting said gates, such that during operation electrically noninterconncted essentially non-rectifying source junctions are held at different voltages, and application of a gate voltage controls effective semiconductor channel region doping type in both (MOSFET) devices, and thus which electrically interconnected rectifying Schottky barrier drain junction forward conducts and which does not forward conduct, thereby controlling the voltage present at the nonsemiconductor components of the electrically interconnected Schottky barrier drain junctions essentially through said forward conducting rectifying semiconductor Schottky barrier junction;

the basis of operation being that said Schottky barrier junctions are formed between said first and second semiconductor channel regions and a material which provides a rectifying junction to a semiconductor channel region when it is doped either N or P-type.

10. A Metal Oxide Semiconductor (MOS) device formed in a surface region of a semiconductor, comprising a Schottky barrier, (selected from the group consisting of rectifying and low reverse bias Schottky barrier potential effected essentially non-rectifying), to a semiconductor channel region junction, wherein a gate to which semiconductor channel region doping type controling voltage can be applied is associated with said semiconductor channel region and offset therefrom by insulating material, such that during use application of a sufficient negative voltage to said gate will cause attraction of holes into said semiconductor channel region, and such that application of sufficient positive voltage to said gate will cause attraction of electrons into said semiconductor channel region, the purpose of applying such gate voltage being to modulate the doping type of said semiconductor channel region; said Schottky barrier junction being formed in a region etched into said semiconductor, which etched region is partially comprised of insulating material, the purpose thereof being to reduce leakage current by limiting the area of Schottky barrier junction in contact with said semiconductor to a region near an end of said semiconductor channel region.

11. A Metal Oxide Semiconductor (MOS) device as in claim 10 in which the etched region in said semiconductor is such that the insulating material by which the gate is offset from the semiconductor channel region is undercut thereby and in which said Schottky barrier junction is present only at the end of said semiconductor channel region which is located under said gate offsetting insulator material.

12. A Metal Oxide Semiconductor Field Effect Transistor (MOSFET) device system formed in a surface region of a semiconductor, comprising two N-type semiconductor Schottky barrier junctions, termed source and drain, separated by a first semiconductor channel region, in functional combination with two P-type semiconductor Schottky barrier junctions, termed source and drain, separated-by a second semiconductor channel region, each Schottky barrier junction comprising a semiconductor and nonsemiconductor component, said functional combination comprising an electrical interconnection between a nonsemiconductor component of one N-type semiconductor Schottky barrier junction and a nonsemiconductor component of one P-type semiconductor Schottky barrier junction, wherein gates to which channel region doping type and conductivity modulating voltages can be applied are associated with each of the first and second semiconductor channel regions, said gates being offset from said first and second semiconductor channel regions by insulating material, such that during operation application of a sufficient negative voltage to the gates atop the N and P-type semiconductors will cause formation of an inversion P-type channel in said N-type semiconductor channel region, and such that application of a sufficient positive voltage to the gates atop the P and N-type semiconductor will cause formation of an inversion N-type channel in said P-type semiconductor channel region, the purpose of applying such gate voltages being to modulate the effective doping type, conductivity and current carrying capability of the channel regions separating respective source and drain Schottky barrier junctions, and of tunneling and leakage current through said Schottky barrier junctions; in which MOSFET device system at least one of said source and drain Schottky barrier junctions is formed in a region etched into said semiconductor, which etched region is partially comprised of an insulating material, the purpose thereof being to reduce leakage current at said source or drain by limiting the area of Schottky barrier junctions in contact with said semiconductor to regions at ends of the associated semiconductor channel region.

13. A (MOSFET) device system as in claim 12 in which said electrical interconnection is also by semiconductor components of said Schottky barrier junctions.

14. A (MOSFET) device system as in claim 12 in which the semiconductor is silicon.

15. A (MOSFET) device system as in claim 12 in which the N and P-type semiconductors are present on a single semiconductor substrate.

16. A (MOSFET) device system as in claim 12 in which a same metal is used to form the N-type and P-type semiconductor Schottky barrier junctions with-both the N and P-type semiconductors during a common simultaneous procedure.

17. A (MOSFET) device system as in claim 12 in which a same metal-silicide is used to form the N-type and P-type semiconductor Schottky barrier junctions with both the N and P-type semiconductors during a common simultaneous procedure.

18. A (MOSFET) device system as in claim 16 in which the metal includes chromium and the semiconductor is silicon.

19. A (MOSFET) device system as in claim 17 in which the metal-silicide includes chromium-disilicide and the semiconductor is silicon.

20. A (MOSFET) device system as in claim 16 in which the metal includes at least one selection from the group consisting of molybdenum, tungstun, vanadium, titanium and platinum and the semiconductor is silicon.

21. A (MOSFET) device system as in claim 17 in which the metal-silicide includes at least one selection from the group consisting of motybdenum-disilicide, tungsten-disilicide, vanadium-disilicide titanium-disilicide and platinum-silicide and the semiconductor is silicon.

22. A (MOSFET) device system as in claim 16 in which the metal effects a Schottky Barrier Potential height of approximately half the bandgap of the semiconductor involved so that rectifying junctions on said N and P-type semiconductor have relatively balanced current-voltage characteristics.

23. A (MOSFET) device system as in claim 17 in which the metal-silicide effects a Schottky Barrier Potential height of approximately half the bandgap of the semiconductor involved so that rectifying junctions on said N and P-type semiconductor have relatively balanced current-voltage characteristics.

24. A P-channel Metal oxide Semiconductor Field Effect Transistor (MOSFET) device system formed in a surface region of N-type semiconductor comprising two N-type semiconductor Schottky barrier junctions, termed source and drain, separated by a first semiconductor channel region, in functional combination with two N-type semiconductor Schottky barrier junctions, termed source and drain, separated by a second semiconductor channel region, said Schottky barrier junctions each comprising a semiconductor and nonsemiconductor component, said functional combination comprising an electrical interconnection between a non-semiconductor component of one N-type semiconductor Schottky barrier junction associated with said first semiconductor channel region, and a nonsemiconductor component of an N-type semiconductor Schottky barrier junction associated with said second semiconductor channel region, wherein gates to which semiconductor channel region doping type inverting voltage can be applied are associated with each of said first and second semiconductor channel regions and offset from said first and second semiconductor channel regions by insulating material, such that during use application a sufficient negative voltage to said gates will cause both of said first and second semiconductor channel regions to invert, the purpose of applying such gate voltages being to modulate the type, conductivity and current carrying capability through said semiconductor channel regions between respective source and drain N-type semiconductor Schottky barrier junctions and of tunneling and leakage current through said Schottky barrier junctions; in which MOSFET device system at least one of said Schottky barrier source and drain junctions is formed in a region etched into said semiconductor, which etched region is partially comprised of insulating material, the purpose thereof being to reduce leakage current at said source or drain by limiting the area of Schottky barrier junctions in contact with said semiconductor to regions at ends of the associated semiconductor channel region.

25. A P-channel (MOSFET) device system formed in a surface region of an N-type semiconductor as in claim 24, in which electrical interconnection is also by way of semiconductor components of said Schottky barrier junctions.

26. An N-channel Metal Oxide Semiconductor Semiconductor Field Effect Transistor (MOSFET) device system formed in a surface region of a P-type semiconductor comprising two P-type semiconductor Schottky barrier junctions, termed source and drain, separated by a first semiconductor channel region, in functional combination with two P-type semiconductor Schottky barrier junctions, termed source and drain, separated by a second semiconductor channel region, said Schottky barrier junctions each comprising a Semiconductor and nonsemiconductor component, said functional combination comprising an electrical interconnection between a nonsemiconductor component of one P-type semiconductor Schottky barrier junction associated with said first semiconductor channel region, and a nonsemiconductor component of a P-type semiconductor Schottky barrier junction associated with said second semiconductor channel region, wherein gates to which semiconductor channel region doping type inverting voltages can be applied are associated with each of the first and second semiconductor channel regions and offset from said first and second semiconductor channel regions by insulating material, such that during use application a sufficient positive voltage to said gates will cause both of said first and second semiconductor channel regions to invert, the purpose of applying such gate voltages being to modulate the type, conductivity and current carrying capability through said semiconductor channel regions between respective source and drain Schottky barrier P-type semiconductor junctions and of tunneling and leakage current through the Schottky barrier junctions; in which MOSFET device system at least one of said source and drain Schottky barrier junctions is formed in a region etched into said semiconductor, which etched region is partially comprised of insulating material, the purpose thereof being to reduce leakage current at said source or drain by limiting the area of Schottky barrier junctions in contact with said semiconductor to regions at ends of the associated semiconductor channel region.

27. An N-channel (MOSFET) device system formed in a surface region of an N-type semiconductor as in claim 26, in which electrical interconnection is also by way of semiconductor components of said Schottky barrier junctions.

28. A (MOSFET) device system as in claim 12 in which the electrically interconnected Schottky barrier junctions are rectifying junctions of an N-channel and a P-channel Schottky barrier (MOSFET) and the resulting system is a (CMOS) system in which the gates of the N-channel and P-channel (MOSFETS) are also electrically interconnected, such that when a constant polarity voltage is applied between the electrically non-interconnected Schottky barrier rectifying junctions, application of sufficient negative gate voltage to form an inverted P-channel in the P-channel (MOSFET) controls the voltage present at the electrically interconnected rectifying Schottky barrier junctions to be closer to the constant polarity voltage applied to the rectifying Schottky barrier junction of the P-channel (MOSFET) formed in N-type semiconductor, and application of positive gate voltage sufficient to form an N-channel in the N-channel (MOSFET) controls the voltage present at the electrically interconnected Schottky barrier rectifying junctions to be closer to the constant polarity voltage applied to the Schottky barrier junction of the N-channel (MOSFET) formed in P-type semiconductor.

29. A (MOSFET) device system as in claim 12 in which the electrically interconnected Schottky barrier junctions are rectifying source and drain junctions of a P-channel and an N-channel (MOSFET) respectively, and the resulting system is an active (MOSFET) in series with a load (MOSFET), and in which the gate of said load (MOSFET) is electrically interconnected to another lead of said load (MOSFET) such that when a voltage is applied between the load (MOSFET) Schottky barrier rectifying source and the load (MOSFET) Schottky barrier rectifying drain said load (MOSFET) is electrically conductive from drain to source, and such that a voltage applied between the active (MOSFET) gate and Schottky barrier rectifying source controls the current flow through said load (MOSFET) drain to source.

30. A (MOSFET) device system as in claim 12, in which the electrically interconnected Schottky barrier junctions are rectifying source and drain junctions of an N-channel and a P-channel (MOSFET) respectively, and the resulting system is an active (MOSFET) in series with a load (MOSFET), and in which the gate of said load (MOSFET) is electrically interconnected to another lead of said load (MOSFET), such that when a voltage is applied between the load (MOSFET) Schottky barrier rectifying source and the load (MOSFET) Schottky barrier rectifying drain said load (MOSFET) is electrically conductive from drain to source, and such that a voltage applied between the active (MOSFET) gate and Schottky barrier rectifying source controls the current flow through said load (MOSFET) drain to source.

31. A P-channel (MOSFET) device system as in claim 24 in which the electrically interconnected Schottky barrier junctions are rectifying source junctions of two P-channel (MOSFETS) and the resulting system is a balanced differential (MOSFET) system, Such that when voltages are applied between the Schottky barrier drain junction of each device and the electrically interconnected Schottky barrier rectifying source junctions, then a voltage difference applied between the gates of the two P-channel (MOSFETS), controls current flow through each said Schottky barrier drain junction.

32. A P-channel (MOSFET) device system as in claim 24 in which the electrically interconnected Schottky barrier junctions are rectifying source and drain junctions of two P-channel (MOSFETS) and the resulting system is an active (MOSFET) in series with a load (MOSFET), and in which the gate of said load (MOSFET) is electrically interconnected to another lead of said load (MOSFET), such that when a voltage is applied between the load (MOSFET) Schottky barrier rectifying source and the load (MOSFET) Schottky barrier drain, said load (MOSFET) is electrically conductive drain to source, and such that a voltage applied between the active (MOSFET) gate and Schottky barrier rectifying source controls the current flow through said load (MOSFET) drain to source.

33. A P-channel (MOSFET) device system as in claim 24 in which the electrically interconnected Schottky barrier junctions demonstrate low reverse bias Schottky barrier potential effected essentially non-rectifying characteristics, and in which the gates of said devices are also electrically interconnected, such that when a constant polarity voltage is applied between the electrically non-interconnected N-type semiconductor Schottky barrier rectifying junctions, a voltage applied between the electrically interconnected gates and one N-type semiconductor rectifying junction controls the voltage present at the electrically interconnected N-type semiconductor Schottky barrier junctions by effecting first and second channel region doping type and thereby which rectifying junction forward conducts and which rectifying junction does not forward conduct, which resulting system is a non-inverting single (MOS) device with operating characteristics similar to multiple device (CMOS) systems, fabricated on a single type semiconductor.

34. A P-channel (MOSFET) device system as in claim 24 in which the electrically interconnected Schottky barrier junctions are rectifying junctions, and in which the gates of said devices are also electrically interconnected, such that when a constant polarity voltage is applied between the N-type semiconductor Schottky barrier electrically non-interconnected junctions, which electrically non-interconnected junctions demonstrate low reverse bias Schottky barrier potential effected essentially non-rectifying characteristics, a voltage applied between the electrically interconnected gates and one N-type Schottky barrier semiconductor junction with essentially non-rectifying characteristics, controls the voltage present at nonsemiconductor components of the electrically interconnected N-type semiconductor Schottky barrier rectifying junctions, which resulting system is an inverting single (MOS) device with operating characteristics similar to multiple device (CMOS) systems, fabricated on a single type semiconductor.

35. An N-channel (MOSFET) device system as in claim 26 in which the electrically interconnected Schottky barrier junctions are rectifying source junctions of two N-channel (MOSFETS) and the resulting system is a balanced differential (MOSFET) system, such that when voltages are provided between the Schottky barrier drain junction of each device and the electrically interconnected Schottky barrier rectifying source junctions, then a voltage difference applied between the gates of the two N-channel (MOSFETS), controls current flow through each said Schottky barrier drain junction.

36. An N-channel (MOSFET) device system as in claim 26 in which the electrically interconnected Schottky barrier junctions are rectifying source and drain junctions of two N-channel (MOSFETS) and the resulting system is an active (MOSFET) in series with a load (MOSFET), and in which the gate of said load (MOSFET) is electrically interconnected to another lead of said load (MOSFET), such that when a voltage is applied between the load (MOSFET) Schottky barrier rectifying source and the load (MOSFET) Schottky barrier drain said load (MOSFET) is electrically conductive drain to source, and such that a voltage applied between the active (MOSFET) gate and Schottky barrier rectifying source controls the current flow through said load (MOSFET) drain to source.

37. An N-channel (MOSFET) device system as in claim 26 in which the electrically interconnected Schottky barrier junctions demonstrate low reverse bias Schottky barrier potential effected essentially non-rectifying characteristics, and in which the gates of said devices are also electrically interconnected, such that when a constant polarity voltage is applied between the electrically non-interconnected P-type semiconductor Schottky barrier rectifying junctions, a voltage applied between the electrically interconnected gates and one P-type semiconductor rectifying junction controls the voltage present at the electrically interconnected P-type semiconductor Schottky barrier drain junctions, by effecting first and second channel region doping type and thereby which rectifying junction forward conducts and which rectifying junction does not forward conduct, which resulting system is a non-inverting single (MOS) device with operating characteristics similar to multiple device (CMOS) systems, fabricated on a single type semiconductor.

38. An N-channel (MOSFET) device system as in claim 26 in which the electrically interconnected Schottky barrier junctions are rectifying junctions, and in which the gates of said devices are also electrically interconnected, such that when a constant polarity voltage is applied between the N-type semiconductor Schottky barrier electrically non-interconnected junctions which electrically non-interconnected junctions demonstrate low reverse bias Schottky barrier potential effected essentially non-rectifying characteristics, a voltage applied between the electrically interconnected gates and one P-type semiconductor Schottky barrier junction with essentially non-rectifying characteristics controls the voltage present at nonsemiconductor components of the electrically interconnected P-type semiconductor Schottky barrier rectifying junctions, which resulting system is an inverting single (MOS) device with operating characteristics similar to multiple device (CMOS) systems, fabricated on a single type semiconductor.

39. A P-channel (MOSFET) device system as in claim 24 in which the Schottky barriers are formed between N-type silicon and at least one material selected from the group consisting of chromium, molybdnium, tungstun, vanadium, titanium, platinum and a silicide thereof.

40. An N-channel (MOSFET) device system as in claim 26 in which the Schottky barriers are formed between P-type silicon and at least one material selected from the group consisting of chromium, molybdnium, tungstun, vanadium, titanium, platinum and a silicide thereof.

41. A (MOSFET) device system as in claim 12, in which one of the two rectifying N-type semiconductor Schottky barrier junctions is rendered essentially non-rectifying.

42. A (MOSFET) device system as in claim 12, in which one of the two rectifying P-type semiconductor Schottky barrier junctions is rendered essentially non-rectifying.

43. A P-channel (MOSFET) device system as in claim 24, in which one of the rectifying N-type semiconductor Schottky barrier junctions is rendered essentially non-rectifying.

44. An N-channel (MOSFET) device system as in claim 26, in which one of the rectifying P-type semiconductor Schottky barrier junctions is rendered essentially non-rectifying.

45. A method of configuring a Metal Oxide Semiconductor (MOS) gate voltage controlled rectification direction device and voltage controlled switch with operating characteristics similar to a non-latching Silicon Controlled Rectifier (SCR), on N-type semiconductor comprising:

a. providing a (MOSFET) with a rectifying Schottky barrier first junction and a non-rectifying second junction present in a surface region of an N-type semiconductor, said first and second junctions being separated by a channel region in said N-type semiconductor, said channel region having an insulator region and gate sequentially situated adjacent thereto;

b. applying a constant positive polarity voltage between said second and first junctions such that said rectifying Schottky barrier first junction is reverse biased, but conducts forward biased current if said applied second to first junction voltage polarity is reversed;

c. applying a negative polarity gate voltage such that the channel region is caused to be inverted P-type by the attraction of holes thereto, thereby effecting a forward bias between said inverted channel region and said rectifying Schottky barrier first junction, such that forward biased current flows therethrough;

the basis of operation being that said Schottky barrier first junction is formed between said semiconductor channel region and a material which provides a rectifying junction to said semiconductor channel region when it is doped either N or P-type.

46. A method of configuring a Metal Oxide Semiconductor (MOS) gate voltage controlled rectification direction device and voltage controlled switch with operating characteristics similar to a non-latching Silicon Controlled Rectifier (SCR), on P-type semiconductor comprising:

a. providing a (MOSFET) with a rectifying Schottky barrier first junction and a non-rectifying second junction in a surface region of a P-type semiconductor, said first and second junctions being separated by a channel region in said P-type semiconductor, said channel region having an insulator region and gate sequentially situated adjacent thereto;

b. applying a constant negative polarity voltage between said second and first junctions such that said rectifying Schottky barrier first junction is reverse biased, but conducts forward biased current if said second to first junction voltage polarity is reversed;

c. applying a positive polarity gate voltage such that the channel region is caused to be inverted N-type by the attraction of electrons thereto, thereby effecting a forward bias between said inverted channel region and said rectifying Schottky barrier first junction, such that forward biased current flows therethrough;

the basis of operation being that said Schottky barrier first junction is formed between a said semiconductor channel region and a material which provides a rectifying junction to said semiconductor channel region when it is doped either N or P-type.

47. A method of configuring a Metal Oxide Semiconductor (MOS) gate voltage controlled rectification direction device and voltage controlled switch with operating characteristics similar to a non-latching Silicon Controlled Rectifier (SCR), on intrinsic semiconductor comprising:

a. providing, in a surface region of an intrinsic semiconductor substrate, a (MOSFET) with a rectifying Schottky barrier first junction and a non-rectifying second junction which are apparent when a constant polarity voltage is applied between said first and second junctions while a constant effective channel region doping level effecting polarity voltage is applied to a gate thereof, said first and second junctions being separated by said channel region in said intrinsic semiconductor substrate, said channel region having an insulator region and said gate sequentially situated adjacent thereto;

b. applying a constant polarity voltage to said gate and a constant polarity voltage between said second and first junctions such that said rectifying Schottky barrier first junction is reverse biased, but conducts forward biased current if said second to first junction voltage polarity is reversed;

c. reversing the polarity of the constant polarity gate voltage such that the channel region is caused to be of a doping type such that said rectifying Schottky barrier first junction is forward biased, such that forward biased current flows therethrough;

the basis of operation being that said Schottky barrier first junction is formed between said semiconductor channel region and a material which provides a rectifying junction to said semiconductor channel region when it is doped either N or P-type.

48. A method of configuring a modulator comprising the steps of:

a. providing a MOSFET structure with a rectifying Schottky barrier junction present at at least one location selected from the group consisting of a source to semiconductor channel region and a drain to semiconductor channel region present in the surface region of a semiconductor, wherein said semiconductor channel region is present directly between said source and drain junctions, and adjacent to which semiconductor channel region is progressively present an insultaing material and a gate, to which semiconductor channel region access is provided via a channel accessing region junction;

b. applying varying drain to source voltage; and c. simultaneously applying varying gate to source voltage and monitoring a modulated resulting voltage presenting at the channel accessing region;

such that the voltage monitored at said channel accessing region is a modulated result of said applied drain and gate to source voltages.

49. A method of configuring a modulator comprising the steps of:

a. providing a MOSFET structure with non-rectifying source to first channel region and drain to a second channel region junctions present in the surface region of a semiconductor, wherein a rectifying Schottky barrier junction region separates said first and second channel regions, said source and drain being set apart from said Schottky barrier junction region by said first and second semiconductor channel regions respectively, adjacent to each of which first and second semiconductor channel regions is progressively present an insultaing material and a gate, with access being available to said Schottky barrier region via a junction thereto;

b. applying varying drain to source voltage; and c. simultaneously applying varying gate to source voltage and monitoring a modulated resulting voltage presenting at the Schottky barrier junction region;

such that the voltage monitored at said Schottky barrier junction region is a modulated result of said applied drain and gate to source voltages.

50. A Metal Oxide Semiconductor (MOS) device system allowing control of a monitored voltage, said system being selected from the group consisting of:

a. a non-inverting single (MOS) device comprising a semiconductor channel region and two rectifying Schottky barrier to channel region junctions in a surface region of a single doping type semiconductor, said rectifying Schottky barrier to channel region junctions being separated by said semiconductor channel region, wherein a gate to which semiconductor channel region doping type modulating voltage can be applied is associated with said semiconductor channel region, said gate being offset from said semiconductor channel region by an insulating material, said monitored voltage being accessed at a junction to said semiconductor channel; and b. an inverting single (MOS) device comprising first and second essentially non-rectifying channel region junctions in a surface region of a single doping type semiconductor, said first and second essentially non-rectifying channel region junctions being separated by first and second semiconductor channel regions from electrically interconnected rectifying Schottky barrier to channel region junctions, wherein first and second gates to which semiconductor channel region doping type effecting modulating gate voltage can be applied are associated with said first and second semiconductor channel regions, said first and second gates being offset from said first and second semiconductor channel regions, respectively, by insulating material, said monitored voltage being accessed at a junction to the electrically interconnected rectifying Schottky barriers at a location between said first and second channel regions;

such that in use application of a positive polarity voltage to a gate causes an associated channel region to become effectively N-type by the attraction of electrons thereinto and application of a negative polarity voltage to said gate caused the channel region to become effectively P-type by attraction of holes thereinto, and such that a Schottky barrier to channel region junction is rectifying to said channel with either channel region effective doping present, but such that the direction of forward conduction through a rectifying Schottky barrier to channel region junction with effective N-type doping present is opposite to that with effective P-type doping present such that:

a. when a constant polarity voltage is applied between said first and second Schottky barrier junctions in said non-inverting single (MOS) device and said channel region effective doping is caused to switch from one effective doping type (N-type/P-type) to the other (P-type/N-type), by the changing of applied gate voltage polarity, the monitored voltage present in said channel region, at said junction thereto, between said first and second Schottky barrier junctions changes from essentially that applied to one of said first and second Schottky barrier junctions to that applied to the other of said first and second Schottky barrier junctions, because of the reversal of forward conduction direction in said Schottky barrier to channel region junctions;

b. when a constant polarity voltage is applied between said first and second essentially non-rectifying channel region junctions in said inverting single (MOS) device, and said first and second channel regions effective doping is caused to switch from one effective doping type (N-type/P-type) to the other (P-type/N-type), by the changing of applied first and second gate voltage polarity, the monitored voltage present at junction to the electrically interconnected rectifying Schottky barrier junctions changes from essentially that applied to one of said first and second non-rectifying junctions to that applied to the other of said first and second non-rectifying junctions, because of the reversal of forward conduction direction in said Schottky barrier to channel region junctions.

51. A noninverting single Metal Oxide Semiconductor (MOS) device with operating characteristics similar to multiple device Complimentary Metal Oxide Semiconductor (CMOS) systems in which an applied gate voltage controls a voltage present at an essentially electrically isolated terminal thereof; comprising first and second rectifying Schottky barrier channel region junctions in a surface region of a single doping type semiconductor, said first and second rectifying Schottky barrier channel region junctions being separated by first and second semiconductor channel regions from electrically interconnected essentially nonrectifying channel region junctions, wherein first and second gates to which semiconductor channel region doping type effecting modulating gate voltage can be applied are associated with said first and second semiconductor channel regions, said first and second gates being offset from said first and second semiconductor channel regions, respectively, by insulating material, such that application of a sufficient negative voltage to the first and second gates will attract holes into said first and second semiconductor channel regions, and such that application of a sufficient positive voltage to the first and second gates will attract electrons into said first and second semiconductor channel regions, the purpose of applying such gate voltage being to modulate the effective doping type of said first and second semiconductor channel regions, such that when a constant polarity voltage is applied between said first and second rectifying Schottky barrier channel region junctions one rectifying Schottky barrier to channel region junction forward conducts while the other simultaneously does not, which Schottky barrier to channel region junction forward conducts at a specific time being determined by semiconductor doping type in said first and second semiconductor channel regions, said semiconductor doping type being determined by applied gate voltage polarity, which essentially electrically isolated terminal electrically contacts, via a junction thereto, said electrically interconnected essentially nonrectifying channel region junctions between said first and second semiconductor channel regions and during use monitors a constant polarity voltage applied to one of the first and second rectifying Schottky barrier to channel region junctions, which constant polarity voltage appears at said essentially electrically isolated terminal essentially through the forward conducting Schottky barrier to channel region junction, which constant polarity voltage monitored by said essentially electrically isolated terminal increases when the gate voltage applied to said first and second gates is increased; the basis of operation being that said Schottky barrier junctions are formed between said first and second semiconductor channel regions and a material which provides a rectifying junction to a semiconductor channel region when it is doped either N or P-type.

52. A non-inverting single Metal Oxide Semiconductor (MOS) device with operating characteristics similar to multiple device Complimentary Metal Oxide Semiconductor (CMOS) systems as in claim 51 in which the essentially electrically isolated terminal contact to said electrically interconnected essentially nonrectifying channel region junctions is essentially non-rectifying.

53. A non-inverting single Metal Oxide Semiconductor (MOS) device with operating characteristics similar to multiple device Complimentary Metal Oxide Semiconductor (CMOS) systems as in claim 51 in which at least one of said Schottky barrier to channel region junctions is formed in a region etched into said semiconductor, said etched semiconductor region being partially comprised of insulating material, the purpose thereof being to reduce leakage current by limiting the area of Schottky barrier to channel region junctions in contact with semiconductor to regions at ends of said semiconductor channel region.

54. A non-inverting single Metal Oxide Semiconductor (MOS) device with operating characteristics similar to multiple device Complimentary Metal Oxide Semiconductor (CMOS) systems as in claim 51 in which the semiconductor is silicon and the Schottky barrier to channel region junctions are formed between said silicon and at least one material selected from the group consisting of chromium, molybdnium, tungstun, vanadium, titanium, platinum and a silicide of any thereof.

55. A P-channel (MOSFET) device system as in claim 24 in which the said Schottky barrier junctions are formed between said semiconductor channel region with and material which effects a Schottky Barrier Potential height of approximately half the bandgap of the semiconductor involved.

56. A P-channel (MOSFET) device system as in claim 24 in which the semiconductor is silicon and the Schottky barrier junctions are formed between said semiconductor channel region and at least one material selected from the group consisting of chromium, molybdenum, tungstun, vanadium, titanium and platinum and silicides thereof.

57. An N-channel (MOSFET) device system as in claims 26 in which the said Schottky barrier junctions are formed between said semiconductor channel region with and material which effects a Schottky Barrier Potential height of approximately half the bandgap of the semiconductor involved.

58. An N-channel (MOSFET) device system as in claim 26 in which the semiconductor is silicon and the Schottky barrier junctions are formed between said semiconductor channel region and at least one material selected from the group consisting of chromium, molybdenum; tungstun, vanadium, titanium and platinum and silicides thereof.

59. A non-inverting single (MOS) device as in claim 1 in which the said Schottky barrier junctions are formed between said semiconductor channel region with and material which effects a Schottky Barrier Potential height of approximately half the bandgap of the semiconductor involved.

60. An inverting single (MOS) device as in claim 5 in which the said Schottky barrier junctions are formed between said semiconductor channel region with and material which effects a Schottky Barrier Potential height of approximately half the bandgap of the semiconductor involved.

61. An inverting single (MOS) device as in claim 51 in which the said Schottky barrier junctions are formed between said semiconductor channel region with and material which effects a Schottky Barrier Potential height of approximately half the bandgap of the semiconductor involved.

62. A Metal Oxide Semiconductor (MOS) device comprising first and second junctions at first and second ends of a channel region selected from the group consisting of a continuous channel region and at least two electrically interconnected channel regions, at least one of which junctions is a rectifying Schottky barrier junction, said first and second junctions being separated by said channel region and said channel region having insulator material and gate sequentially situated adjacent thereto, said (MOS) device further comprising an essentially electrically isolated junction to a point thereof, located between said first and second junctions such that applying a constant polarity voltage between said second and first junctions causes said at least one rectifying Schottky barrier junction to be reverse biased when said channel region doping is caused to be of a first type selected from the group selected from N-type and P-type, but such that it becomes forward biased if said applied second to first junction voltage polarity is reversed, and such that applying a channel region effective doping type inverting polarity voltage to the gate effects a forward bias between said inverted doping type channel region and said at least one rectifying Schottky barrier junction, which essentially electrically isolated junction monitors a voltage appearing thereat essentially through said forward biased rectifying Schottky barrier junction in use, the basis of operation being that said rectifying Schottky barrier junction is formed between said semiconductor channel region and a material which provides a rectifying junction to said semiconductor channel region when it is doped either N or P-type.

* * * * *